US012520669B2

(12) United States Patent
Zeng

(10) Patent No.: US 12,520,669 B2
(45) Date of Patent: Jan. 6, 2026

(54) DISPLAY PANEL AND DISPLAY DEVICE

(71) Applicant: Hubei Yangtze Industrial Innovation Center of Advanced Display Co., LTD., Wuhan (CN)

(72) Inventor: Yang Zeng, Shanghai (CN)

(73) Assignee: Hubei Yangtze Industrial Innovation Center of Advanced Display Co., LTD., Wuhan (CN)

(*) Notice: Subject to any disclaimer, the term of this patent is extended or adjusted under 35 U.S.C. 154(b) by 547 days.

(21) Appl. No.: 17/977,445

(22) Filed: Oct. 31, 2022

(65) Prior Publication Data

US 2024/0040841 A1    Feb. 1, 2024

(30) Foreign Application Priority Data

Jul. 29, 2022    (CN) .......................... 202210911273.6

(51) Int. Cl.
     *H10K 59/122*    (2023.01)
     *H10K 50/86*    (2023.01)

(52) U.S. Cl.
     CPC ......... *H10K 59/122* (2023.02); *H10K 50/865* (2023.02)

(58) Field of Classification Search
     CPC ................................................ H10K 59/8792
     See application file for complete search history.

(56) References Cited

U.S. PATENT DOCUMENTS

| | | | |
|---|---|---|---|
| 2018/0331326 A1* | 11/2018 | Woo | ..................... H10K 50/865 |
| 2022/0077430 A1* | 3/2022 | Choi | ................... H10K 59/8792 |
| 2024/0397798 A1* | 11/2024 | Li | ......................... H10K 59/122 |

FOREIGN PATENT DOCUMENTS

| | | |
|---|---|---|
| CN | 107134543 A | 9/2017 |
| CN | 110047889 A | 7/2019 |
| CN | 111326636 A | 6/2020 |
| CN | 212517208 U | 2/2021 |
| CN | 114156308 A | 3/2022 |
| CN | 114361359 A | 4/2022 |

* cited by examiner

*Primary Examiner* — Christine S. Kim
*Assistant Examiner* — Andrew Victor Prostor
(74) *Attorney, Agent, or Firm* — Anova Law Group, PLLC

(57) ABSTRACT

A display panel and a display device are provided. The display panel includes: a substrate; a planarization layer on a side of the substrate; a pixel definition layer on a side of the planarization layer away from the substrate; a first electrode layer on a side of the pixel definition layer away from the planarization layer; and a black matrix layer on a side of the first electrode layer away from the pixel definition layer. The black matrix layer is provided with first openings. The first electrode layer is provided with first components. One first component overlaps one corresponding first opening; and a surface of one first component is a non-planar surface.

18 Claims, 30 Drawing Sheets

DISPLAY PANEL AND DISPLAY DEVICE

CROSS-REFERENCE TO RELATED APPLICATION

This application claims the priority of Chinese Patent Application No. 202210911273.6, filed on Jul. 29, 2022, the content of which is incorporated herein by reference in its entirety.

TECHNICAL FIELD

The present disclosure generally relates to the field of display technologies and, more particularly, relates to a display panel and a display device.

BACKGROUND

In a color filter on thin film encapsulation (or color filter on TFE, or CFOT) type display panel, it is often necessary to set a light-transmitting hole in a part of the display panel to cooperate with optical fingerprint on display (FOD) technology or an ambient light sensor, etc. The light-transmitting hole includes an opening set in a black matrix (BM) layer and penetrating through a thickness of the film layer. The existence of the opening may cause that a highly reflective cathode set in the film layer below the opening to be exposed and damaged. Therefore, the light incident from the opening will be reflected by the highly reflective cathode and then exit from the opening again, resulting in an increase in an overall reflectivity of the display panel and further deterioration of the display effect of the display panel.

SUMMARY

One aspect of the present disclosure provides a display panel. The display panel includes a substrate; a planarization layer on a side of the substrate; a pixel definition layer on a side of the planarization layer away from the substrate; a first electrode layer on a side of the pixel definition layer away from the planarization layer; and a black matrix layer on a side of the first electrode layer away from the pixel definition layer. The black matrix layer includes first openings. The first electrode layer includes first components. One first component overlaps a corresponding first opening; and a surface of the first component is a non-planar surface.

Another aspect of the present disclosure provides a display device. The display device includes a display panel. The display panel includes a substrate; a planarization layer on a side of the substrate; a pixel definition layer on a side of the planarization layer away from the substrate; a first electrode layer on a side of the pixel definition layer away from the planarization layer; and a black matrix layer on a side of the first electrode layer away from the pixel definition layer. The black matrix layer includes first openings. The first electrode layer includes first components. One first component overlaps a corresponding first opening; and a surface of the first component is a non-planar surface.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
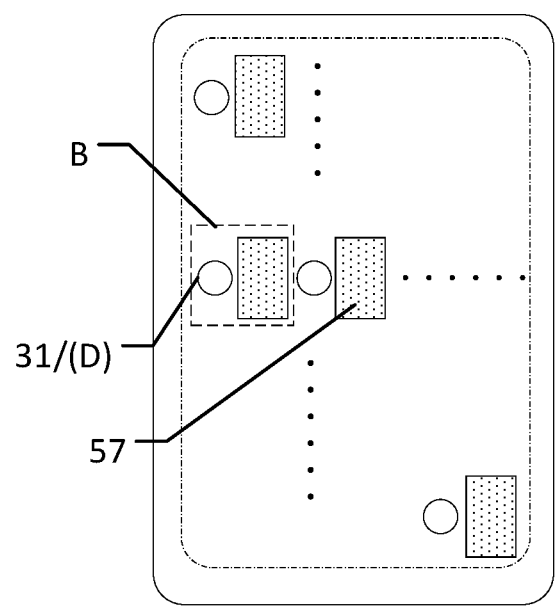
FIG. 1 illustrates a top view of an exemplary display panel consistent with various disclosed embodiments of the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

The present disclosure provides a display panel and a display device to at least partially alleviate the problem of a poor display effect of a display panel where a light-transmitting hole is disposed in a BM layer.

Figure 2:
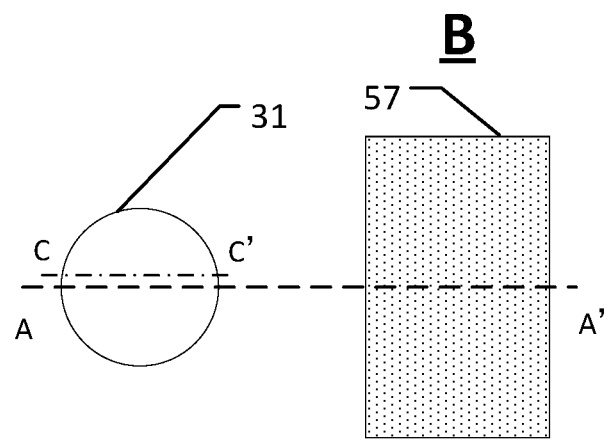
FIG. 2 illustrates a locally enlarged view of a B region in the display panel in FIG. 1 consistent with various disclosed embodiments of the present disclosure.
Figure 3:
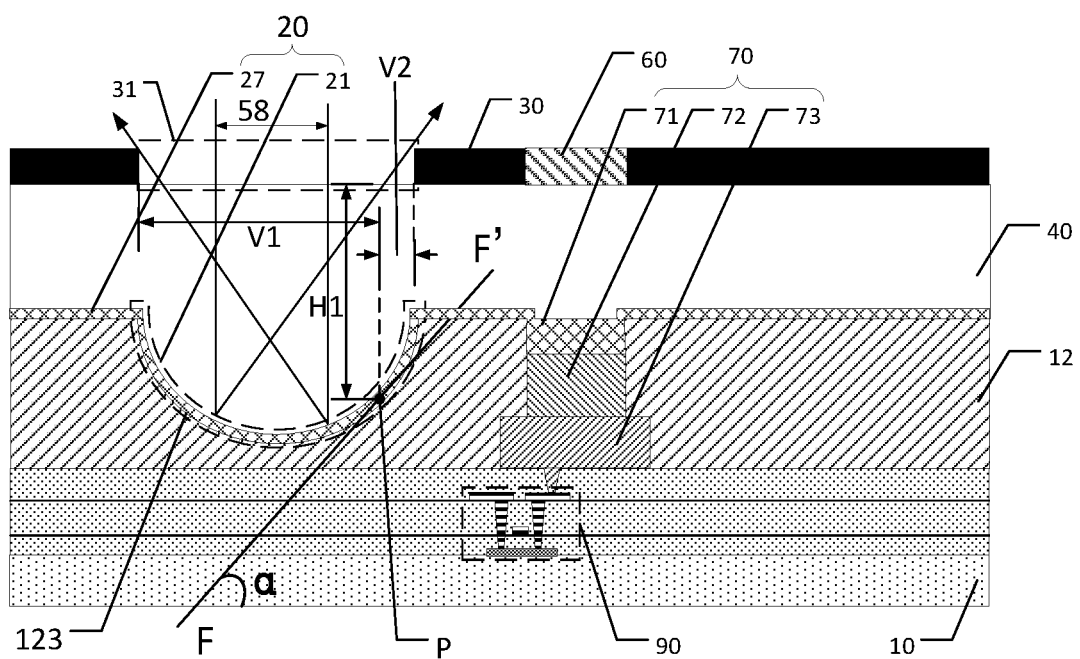
FIG. 3 illustrates a cross-sectional view of a region of the display panel in FIG. 2 along an AA' direction, consistent with various disclosed embodiments of the present disclosure.
Figure 4:
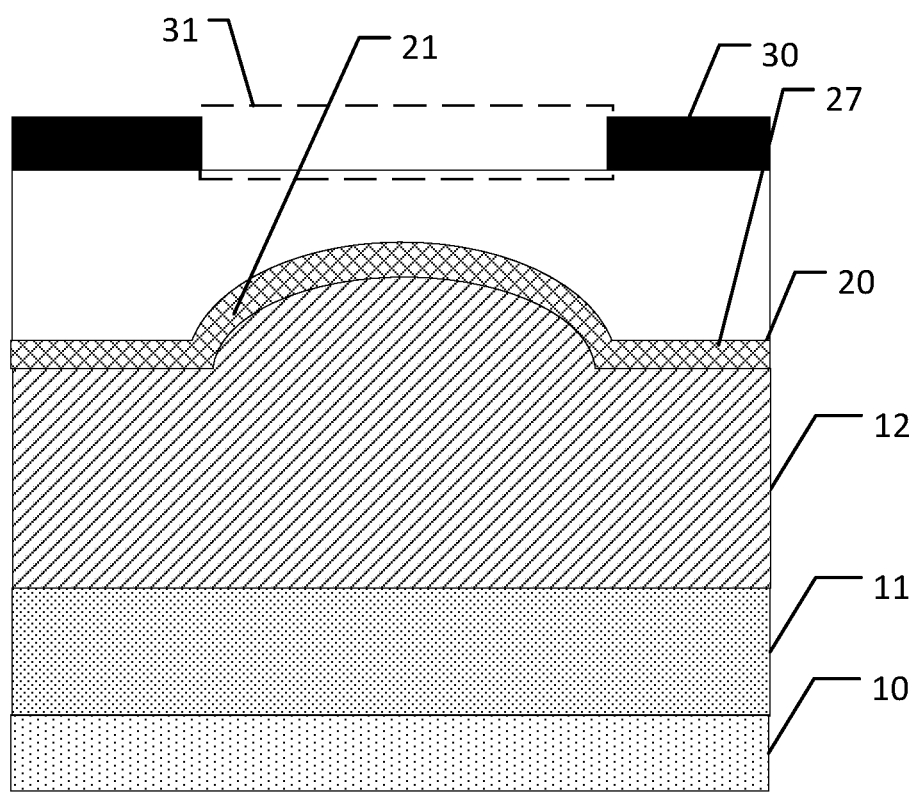
FIG. 4 illustrates a cross-sectional view of a region of the display panel in FIG. 2 along a CC' direction, consistent with various disclosed embodiments of the present disclosure.

The present disclosure provides a display panel. FIG. 1 illustrates a top view of an exemplary display panel according to one embodiment of the present disclosure, FIG. 2 illustrates a locally enlarged view of a B region in the display panel shown in FIG. 1, FIG. 3 illustrates a cross-sectional view of the display panel in FIG. 2 along an AA' direction, and FIG. 4 illustrates a cross-sectional view of the display panel in FIG. 2 along a CC' direction As shown in FIG. 1 to FIG. 4, in one embodiment, the display panel 100 may include a substrate 10, a planarization layer 11 on a side of the substrate 10, a pixel definition layer 12 on a side of the planarization layer 11 away from the substrate 10, a first electrode layer 20 on a side of the pixel definition layer 12 away from the planarization layer 11, a black matrix layer 30 on a side of the first electrode layer 20 away from the pixel definition layer 12.

First openings 31 may be disposed in the black matrix layer 30.

The first electrode layer 20 may include a first component 21. The first component 21 may overlap one corresponding first opening 31, and the surface of the first component 21 may be non-planar.

The display panel 100 may include the substrate 10, the planarization layer 11, the pixel definition layer 12, the first electrode layer 20, and the black matrix layer 30 that are stacked. The black matrix layer 30 may include at least one first opening 31, and the first electrode layer 20 may be provided with at least one first component 21. In a stacking direction of the first electrode layer 20 and the black matrix layer 30, one first component 21 and one correspondingly arranged first opening 31 may at least partially overlap. In a cross-section perpendicular to the substrate 10 (such as the cross-section shown in FIG. 2), the at least partial overlap of the first component 21 and the corresponding first opening 31 may include that: the size of the first component 21 is larger than that of the first opening 31, or the size of the first component 21 is equal to the size of the first opening 31, or the size of the first component 21 is smaller than the size of the first opening 31. From the top view direction of the display panel, the at least partial overlap of the first component 21 and the first opening 31 may include that: the outline of the first component 21 is located within the outline of the first opening 31, or the outline of the first component 21 coincides with the outline of the first opening 31, or the outline of the first component 21 is located outside the outline of the first opening 31. The outlines here may be understood as the outlines of the projected patterns of the first component 21 or the first opening 31 on the plane where the substrate 10 is located.

In the present disclosure, the surface of the first component 21 in the first electrode layer 20 may be non-planar, and at least part of the ambient light entering from the first opening 31 may be reflected to other directions (not the direction toward the first opening 31) by the non-planar first component 21, such that at least a part of the light may be absorbed by the black matrix layer 30. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

In the present disclosure, the non-planar first component 21 may reflect the ambient light entering from the first opening 31 in a specific direction according to a specific law, such that the light emitted from the first opening 31 after reflection may be proportionally reduced, to realize reflection of ambient light in a customized direction. Therefore, the amount of light emitted from the first opening 31 after being reflected by the first component 21 of the first electrode layer 20 may be reduced or even eliminated.

The display panel 100 may include a plurality of sub-pixels 57 arranged in an array. In one embodiment shown in FIG. 1, one first opening 31 may be arranged next to a corresponding sub-pixel 57 of the plurality of sub-pixels 57, and may not have an overlapping area with the corresponding sub-pixel 57. In some other embodiments, according to requirements, the first opening 31 and the corresponding sub-pixels 57 may also be set to have an overlapping area, which is not specifically limited in the present disclosure.

It should be noted that "non-planar" may be understood as that the surface of the first component 21 is not parallel to the plane where the substrate 10 is located, or the surface of the first component 21 is not parallel to the plane where the display panel 100 is located, or the surface of the first component 21 is not parallel to the horizontal plane when the display panel 100 is placed horizontally. For example, the surface of the first component 21 may be a curved surface, or the surface of the first component 21 may be an inclined surface and the included angle between the inclined surface and the plane where the substrate 10 is located may be larger than zero. That is, the first electrode layer 20 may include a portion (the first component 21) that is not parallel to the plane where the substrate 10 is located.

Both the pixel definition layer 12 and the planarization layer 11 may be made of organic materials. The pixel definition layer 12 may be made of a material including polyimide (PI), polyamide, benzocyclobutene (BCB), acrylic resin or phenolic resin. The planarization layer 11 may be made of a material including organic resin or photosensitive resin, such as acrylic, polyimide (PI) or benzocyclobutene (BCB).

The first electrode layer 20 may be disposed on one surface of the pixel definition layer 12 away from the substrate 10. In one embodiment, the first electrode layer 20 may be formed by an evaporation deposition process. In another embodiment, the first electrode layer 20 may be fabricated by a sputtering deposition process. The first electrode layer 20 may be formed after the pixel definition layer 12. The pixel definition layer 12 may include openings for defining light-emitting elements. The first electrode layer 20 may cover positions where the openings are provided and the positions where the openings are not provided in the pixel definition layer 12, that is, the first electrode layer 20 may cover entire areas of the pixel definition layer 12. When the evaporation deposition process is adopted, the entire surface may be evaporated without using a mask with array openings. When the display panel 100 includes light-emitting elements, the related fabrication sequence may be: fabricating the anode, fabricating the pixel definition layer, fabricating the light-emitting layer, and then fabricating the first electrode layer and other film structures.

The thickness of the first electrode layer 20 may range from 50 to 200 nm. It can be seen that the thickness of the first electrode layer 20 is relatively small. Since the thickness of the first electrode layer 20 is relatively small, a shape of a (non-planar) surface of one first component 21 far away from the substrate 10 may also be understood as the shape formed by the first component 21 itself. For example, the non-planar structure on the side of the first component 21 away from the substrate 10 may be same as its own shape, such as the first component 21 of the first electrode layer 20 may present a non-planar structure as a whole. Specifically, for example, the thickness of the first component 21 may be equal everywhere and the side of the first component 21 away from the substrate 10 may present a non-planar structure.

At least part of the film layer in the display panel 100 located on the side close to the substrate 10 may be provided with a specific shape and structure, to realize the formation of the non-planar first component 21 in the first electrode layer 20, and it may be unnecessary to adjust the manufacturing process of the first electrode layer 20. In one embodiment as shown in FIG. 3, the non-planar first component 21 may be formed by recess of a horizontal portion 27 in the first electrode layer 20 toward a side close to the substrate 10. In another embodiment as shown in FIG. 4, the non-planar first component 21 may be formed by a recess (may be understood as a protrusion) of a horizontal portion 27 in the first electrode layer 20 toward a side away from the substrate 10.

Figure 5:
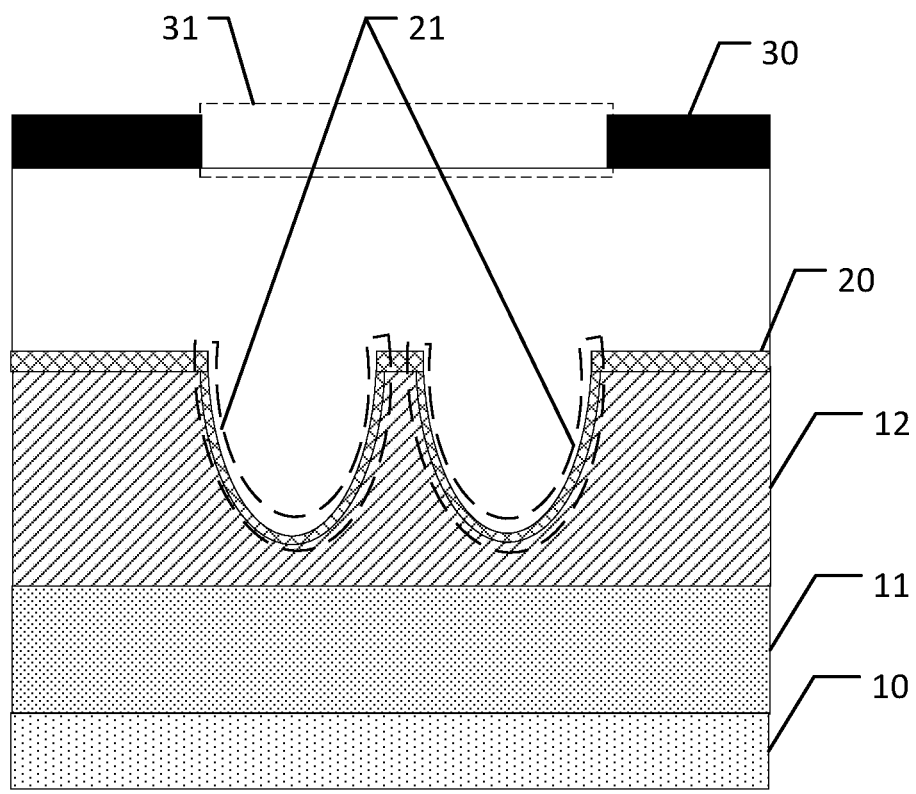
FIG. 5 illustrates another cross-sectional view of a region of the display panel in FIG. 2 along a CC' direction, consistent with various disclosed embodiments of the present disclosure.
Figure 6:
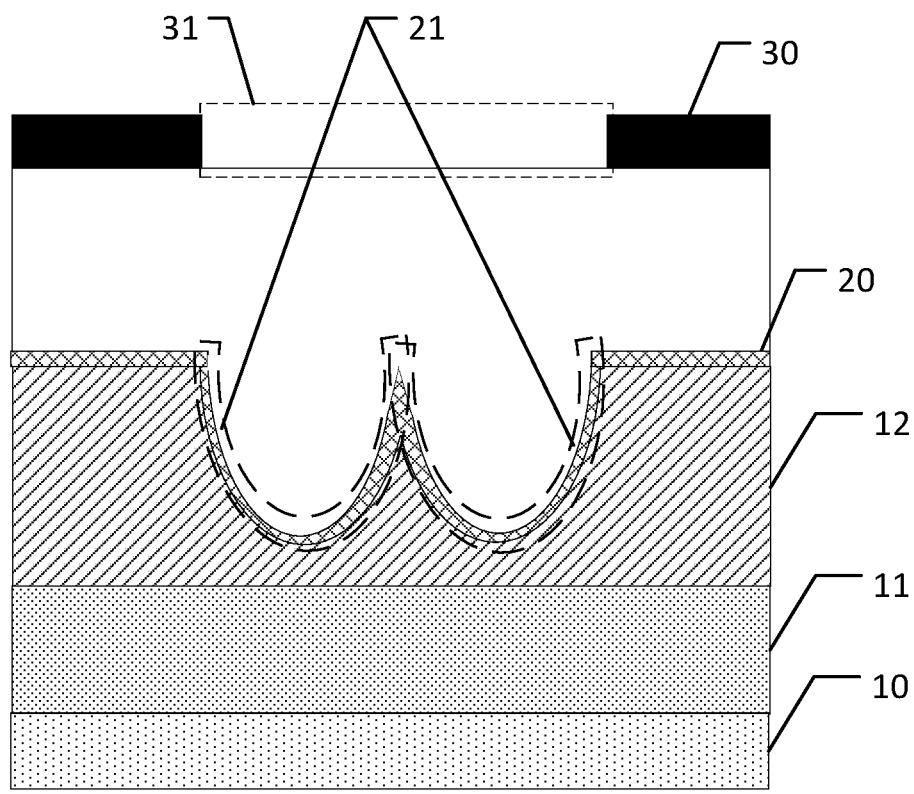
FIG. 6 illustrates another cross-sectional view of a region of the display panel in FIG. 2 along a CC' direction, consistent with various disclosed embodiments of the present disclosure.
Figure 7:
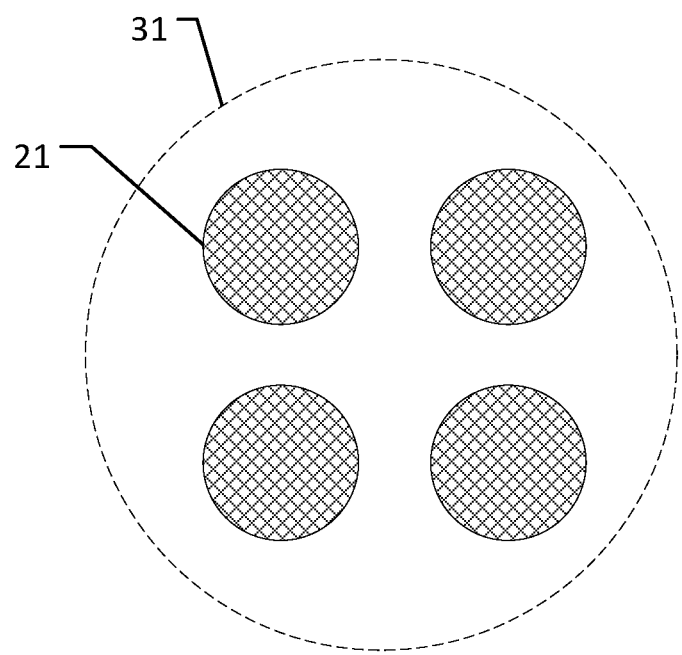
FIG. 7 illustrates a locally enlarged view of a B region in the display panel in FIG. 1 consistent with various disclosed embodiments of the present disclosure.
Figure 8:
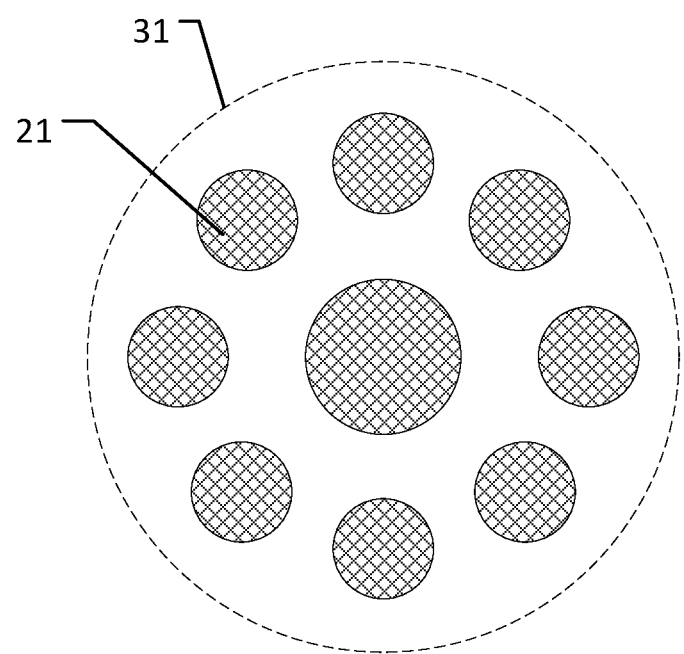
FIG. 8 illustrates another locally enlarged view of a D region in the display panel in FIG. 1 consistent with various disclosed embodiments of the present disclosure.

FIG. 5 illustrates another cross-sectional view of a region of the display panel in FIG. 2 along a CC' direction, consistent with various disclosed embodiments in the present disclosure; FIG. 6 illustrates another cross-sectional view of a region of the display panel in FIG. 2 along a CC' direction, consistent with various disclosed embodiments in the present disclosure; FIG. 7 illustrates a locally enlarged view of a B region in the display panel in FIG. 1 consistent with various disclosed embodiments in the present disclosure; and FIG. 8 illustrates another locally enlarged view of a D region in the display panel in FIG. 1 consistent with various disclosed embodiments in the present disclosure. As shown in FIG. 1 to FIG. 8, one first component 21 may include a curved surface.

Specifically, in the display panel 100, one first component 21 in the first electrode layer 20 may be configured to be non-planar. As mentioned above, the "non-planar" may include at least one of a curved surface or an inclined surface. Thus, the first electrode layer 20 may include a portion (the first component 21) that is not parallel to the plane where the substrate 10 is located. The present disclosure does not specifically limit the number of curved surfaces included in the first component 21. For example, as shown in FIG. 3 and FIG. 4, the first component 21 may include one curved surface. In another embodiment, as shown in FIG. 5 and FIG. 6, the first component 21 may include two curved surfaces. In another embodiment, as shown in FIG. 7 and FIG. 8, the first component 21 may include three of four curved surfaces. In some other embodiments, the first component 21 may include more curved surfaces as long as the first component 21 can be made non-planar. Correspondingly, the first component 21 corresponding to the first openings 31 that can be set in this application includes one curved surface, and the first component 21 corresponding to the first openings 31 may include two curved surfaces, three curved surfaces, four curved surfaces arranged in 2 rows and 2 columns, or one large, curved surface in the middle with some small curved surfaces around it.

The present disclosure also does not specifically limit the recess direction of the curved surface. For example, the curved surface may be formed by recess toward the side facing the substrate 10 or the side facing the black matrix layer 30, as long as the first component 21 is made non-planar. Furthermore, the present disclosure also does not specifically limit the curvature radius of the curved surface, and the user may adjust the setting according to actual needs.

As shown in FIG. 1 to FIG. 8, in some embodiments, the curved surface may be a spherical surface.

Specifically, in one embodiment, the first component 21 in the first electrode layer 20 may be made non-planar, and the "non-planar" here may specifically include a spherical surface when it is set as a curved surface.

The present disclosure does not specifically limit the number of spherical surfaces included in one first component 21. For example, one first component 21 may include one spherical surface, or may include two, three, or more spherical surfaces, as long as the first component 21 is made non-planar. Correspondingly, the first component 21 corresponding to the first openings 31 that can be set in this application includes one curved surface, and the first component 21 corresponding to the first openings 31 may include two curved surfaces, three curved surfaces, four curved surfaces arranged in 2 rows and 2 columns, or one large, curved surface in the middle with some small curved surfaces around it.

As shown in FIG. 1 to FIG. 6, optionally, the cross-section of the curved surface may be a semicircle or a minor arc, and the cross-section may be perpendicular to the plane where the substrate 10 is located.

Specifically, in one embodiment, when the first component 21 is a curved surface, along the direction perpendicular to the plane where the substrate 10 is located, the cross-section of the curved surface may be a semicircle or a minor arc. It should be noted that the semicircle or inferior arc is only an optional embodiment provided by the present disclosure which does not limit the scope of the present disclosure, and the user may select and set the cross-sectional shape of the curved surface according to requirements.

Figure 9:
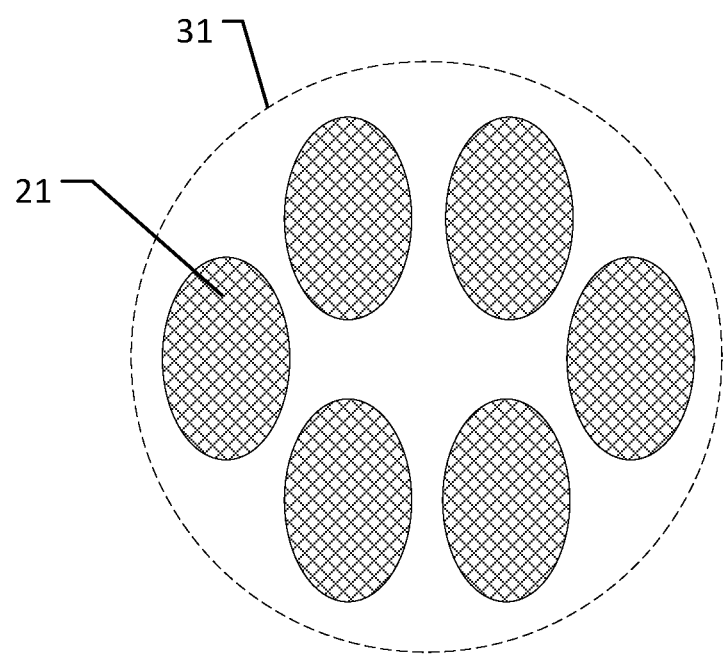
FIG. 9 illustrates another locally enlarged view of a D region in the display panel in FIG. 1 consistent with various disclosed embodiments of the present disclosure.

FIG. 9 shows another schematic diagram of the area D in FIG. 1 according to one embodiment of the present disclosure. As shown in FIG. 1 to FIG. 9, in one embodiment, along the direction (the view direction) perpendicular to the plane where the substrate 10 is located, a shape of an orthographical projection of the first component 21 on the plane of the substrate 10 may be circular or oval.

Specifically, in one embodiment, along the direction (the view direction) perpendicular to the plane where the substrate 10 is located, a shape of an orthographical projection of the first component 21 on the plane of the substrate 10 may be circular or oval, such that the cross section of the first component 21 can be specifically a curved surface, a spherical surface, a semicircle, or a minor arc, and so on.

In the above embodiments, the surface of the first components 21 in the first electrode layer 20 may be non-planar. One non-planar first component 21 may at least reflect a portion of the ambient light entering from one corresponding first opening 31 in different directions (not the direction toward the first opening 31), such that at least a part of the light may be reflected by the surface of the first component 21 to the surface of the black matrix layer 30 close to the first electrode layer 20 and be absorbed by the black matrix layer 30. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

Figure 10:
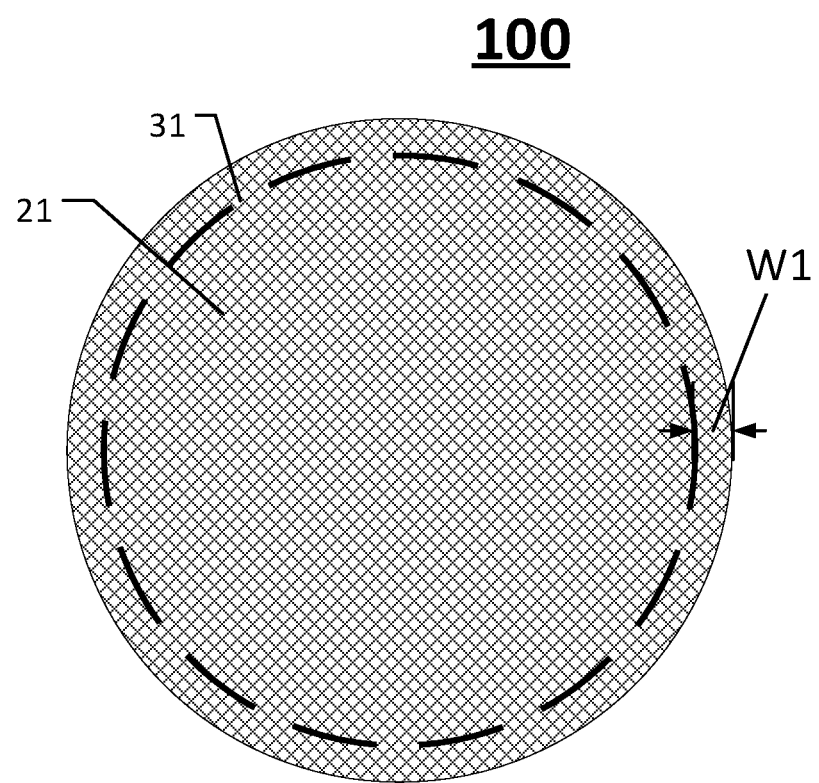
FIG. 10 illustrates another locally enlarged view of a D region in the display panel in FIG. 1 consistent with various disclosed embodiments of the present disclosure.
Figure 11:
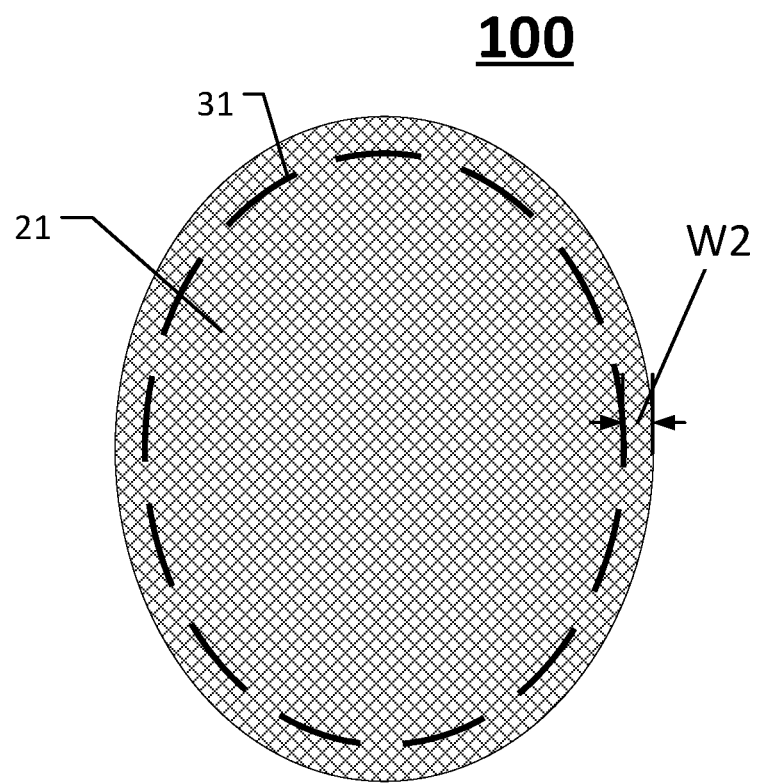
FIG. 11 illustrates another locally enlarged view of a D region in the display panel in FIG. 1 consistent with various disclosed embodiments of the present disclosure.

FIG. 10 shows another schematic diagram of the area D in FIG. 1 according to one embodiment of the present disclosure, and FIG. 11 shows another schematic diagram of the area D in FIG. 1 according to one embodiment of the present disclosure. As shown in FIG. 1 to FIG. 4, FIG. 10, and FIG. 11, in one embodiment, a diameter of the circle may be larger than or equal to the size of the corresponding first opening 31, or a long axis of the ellipse may be larger than or equal to the size of the corresponding first opening 31.

Specifically, in one embodiment, when the orthographic projection of one first component 21 on the plane where the substrate 10 is located is a circle and only one first component 21 is correspondingly provided with one first opening 31, the diameter of the circle may be set to be larger than the size of the first opening 31 or the diameter of the circle may be set to be equal to the size of the first opening 31. In another embodiment, when t the orthographic projection of the first component 21 on the plane where the substrate 10 is located is an ellipse, the long axis of the ellipse may be set to be larger than or equal to the size of the first opening 31. Correspondingly, when the external light enters the surface of the first electrode layer 20 from the first opening 31, most or all of the light may be incident on the surface of the first component 21 (the non-planar part of the first electrode layer 20) without falling into the planar portion of the first electrode layer 20. The non-planar first component 21 may at least reflect a portion of the ambient light entering from one corresponding first opening 31 in different directions (not the direction toward the first opening 31), such that at least a part of the light may be reflected by the surface of the first component 21 to the surface of the black matrix layer 30 close to the first electrode layer 20 and be absorbed by the black matrix layer 30. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

As shown in FIG. 1 to FIG. 4, FIG. 10 and FIG. 11, in one embodiment, the area of the circle may be larger than or equal to the area of the first opening 31. A distance Wi between the circle and the first opening 31 may be larger than or equal to 2 μm, and smaller than or equal to 2 μm.

In another embodiment, the area of the ellipse may be larger than or equal to the area of the first opening 31. A distance Wi between the ellipse and the first opening 31 may be larger than or equal to 2 μm, and smaller than or equal to 2 μm.

Specifically, in one embodiment, the orthographic projection of one first component 21 on the plane where the substrate 10 is located may be a circle and the orthographic projection of one first opening 31 on the plane where the substrate 10 is located may be a circle. Correspondingly, the area of the ellipse may be set to be larger than or equal to the area of the first opening 31, and a minimum range of a distance between edges of orthographic projections of the two circles may be about 0-2 μm (including ending values). Correspondingly, most or all of the light incident through the first opening 21 may be incident on the surface of the first component 21 and then reflected by the non-planar first component 21. Therefore, the amount of the reflective light emitted from the first opening 21 and then the reflectivity of the display panel 100 may be reduced, to improve the display uniformity of the display panel 100.

In another embodiment, the orthographic projection of one first component 21 on the plane where the substrate 10 is located may be an ellipse and the orthographic projection of one first opening 31 on the plane where the substrate 10 is located may be an ellipse. Correspondingly, the area of the ellipse may be set to be larger than or equal to the area of the first opening 31, and a minimum range of distance between adjacent edges of orthographic projections of the two ellipses may be about 0-2 μm (including ending values) when the long axes of the two ellipses are located in a same straight line. Correspondingly, most or all of the light incident through the first opening 21 may be incident on the surface of the first component 21 and then reflected by the non-planar first component 21. Therefore, the amount of the reflective light emitted from the first opening 21 and then the reflectivity of the display panel 100 may be reduced, to improve the display uniformity of the display panel 100.

As shown in FIG. 1 to FIG. 3, in one embodiment, the curved surface may include a first point P, and an angle between a tangent line FF' of the curved surface at the first point P and the substrate 10 may be α, where α>0.

Horizontal distances between the first point P and the first opening 31 may be V1 and V2 where V1>V2.

A vertical distance between the first point P and the black matrix layer 30 may be H1, where $\alpha \geq \arctan(V1/H1) \ast \frac{1}{2}$.

Specifically, in one embodiment, the first component 21 may include a curved surface and the curved surface may include a first point P at any position on the curved surface. The tangent line FF' passing through the first point P may intersect with the extending direction of the plane where the substrate 10 is located, therefore including the first angle α. When the value of a is larger than 0, along the direction perpendicular to the plane where the substrate 10 is located, in the orthographic projections of the first point P and the first opening 31 on the plane where the substrate 10 is located, the horizontal distances between the first point P and the edges of the first opening 31 may be V1 and V2 respectively. V1 may be a maximum horizontal distance between the first point P and the orthographic projection edge of the first opening 31, and V2 may be a minimum horizontal distance between the first point P and the orthographic projection edge of the first opening 31. In the direction perpendicular to the plane where the substrate 10 is located, the vertical distance between the first point P and the plane where the black matrix layer 30 is located may be H1. In one embodiment, it may be configured such that $\alpha \geq \arctan(V1/H1) \ast \frac{1}{2}$. Correspondingly, the ambient light irradiated to the first point P through the first opening 31 not be emitted from the first opening 31 after being reflected by the first component 21. Instead, it may be reflected to the side surface of the black matrix layer 30 close to the first electrode layer 20 and may be absorbed by the black matrix layer 30, thereby reducing or even eliminating the light emitted from the first opening 31 after being reflected by the first electrode layer 20. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

Figure 12:
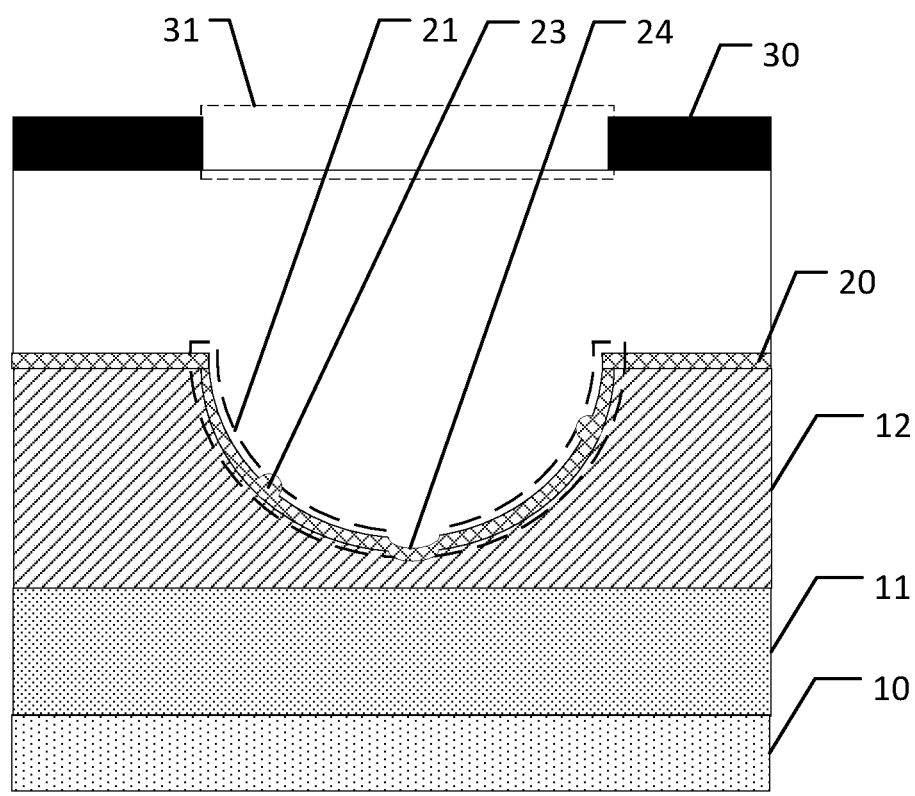
FIG. 12 illustrates another cross-sectional view of a region of the display panel in FIG. 2 along a CC' direction, consistent with various disclosed embodiments of the present disclosure.

FIG. 12 shows another cross-section view of the display panel in FIG. 2 along the CC' direction. As shown in FIG. 1 to FIG. 3, and FIG. 12, in one embodiment, the surface of the first component 21 may include a concave surface.

Specifically, in one embodiment, the surface of the first component 21 may be a concave surface, that is, the cross section of the first component 21 may be a curved surface, a spherical surface, a semicircle, or a minor arc, etc. It should be noted that the present disclosure does not specifically limit the concave direction of the concave surface included in the surface of the first component 21. For example, the concave surface may be formed by recess toward the side of the substrate 10 in one embodiment shown in FIG. 1, or may be formed by recess toward a side of the black matrix layer 30 in another embodiment shown in FIG. 4, as long as a portion of the first component 21 is able to be made non-planar.

As shown in FIG. 12, in another embodiment, the cross section of the first component 21 may be generally a semicircle, and the surface of the semicircle may include one or more small protrusions 23 and/or one or more small depressions 24. That is, a plurality of small curved surfaces may be further formed on the large curved surface, and the first component 21 with the uneven surface (non-planar) may be used to reflect the ambient light incident from the first opening 31. Correspondingly, most of the light may not be emitted from the first opening 31 after being reflected by the first component 21. Instead, it may be reflected to the side surface of the black matrix layer 30 close to the first electrode layer 20 and may be absorbed by the black matrix layer 30, thereby reducing or even eliminating the light emitted from the first opening 31 after being reflected by the first electrode layer 20. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

Figure 13:
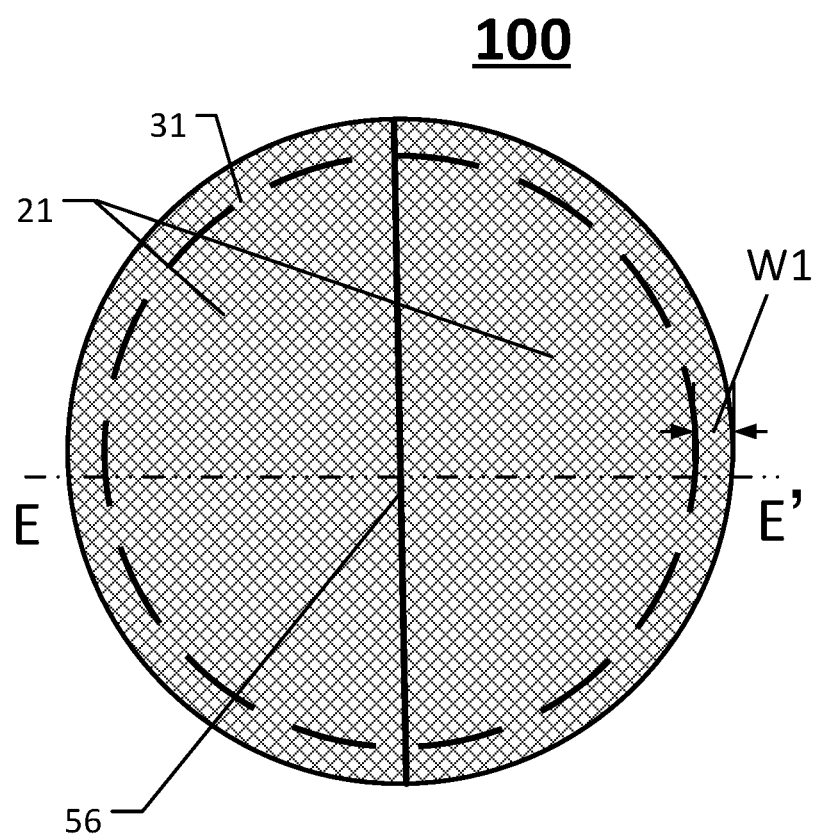
FIG. 13 illustrates another locally enlarged view of a D region in the display panel in FIG. 1 consistent with various disclosed embodiments of the present disclosure.
Figure 14:
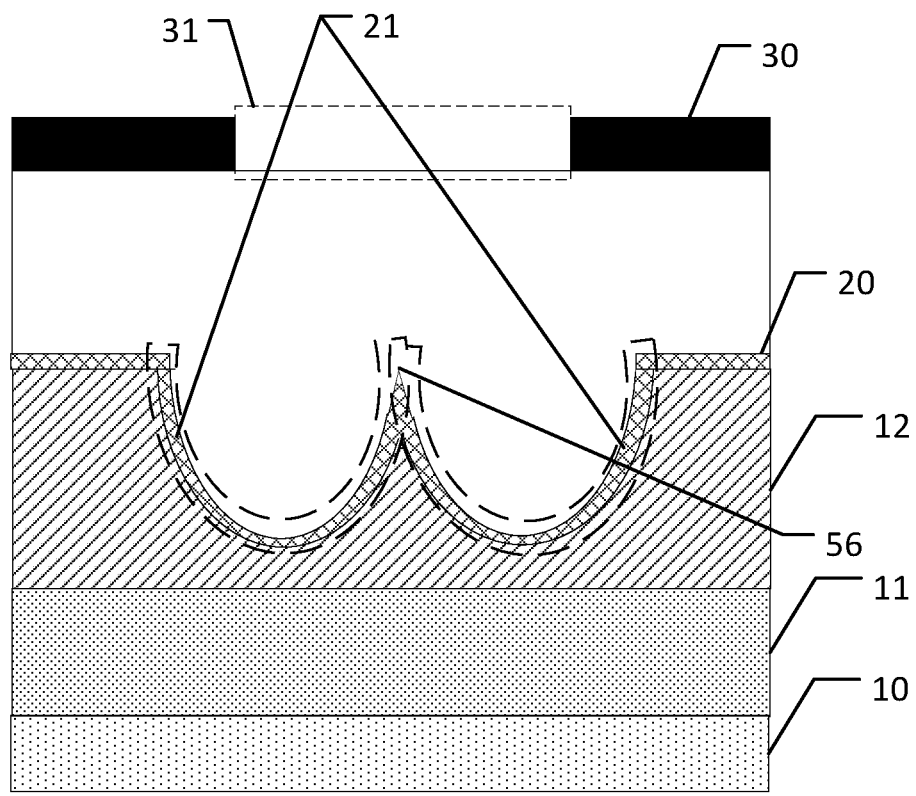
FIG. 14 illustrates a cross-sectional view of a region of the display panel in FIG. 13 along an EE' direction, consistent with various disclosed embodiments of the present disclosure.

FIG. 13 shows another schematic structure of the D region of the display panel in FIG. 1, and FIG. 14 shows another cross-section view of the display panel in FIG. 13 along the EE' direction. As shown in FIG. 1, FIG. 13, and FIG. 14, in one embodiment, the surface of the first component 21 may include at least two concave surfaces. Joint portions 56 between adjacent concave surfaces may overlap with the first openings 31. One concave surface may include a portion overlapping with the first opening 31 and another portion overlapping with the black matrix layer 30.

Specifically, in one embodiment, a plurality of concave surfaces may be provided on the lower side of one corresponding first opening 31. For example, two intersecting concave surface structures may be provided, and a joint portion 56 may be presented between two adjacent concave surfaces. The joint portion 56 may not have a large reflective surface (shown as a sharp corner in FIG. 14), to reduce or eliminate the amount of reflected light reflected by the joint portion 56 into the first opening 31. In one embodiment, an orthographic projection of the joint portion 56 on the plane where the substrate 10 is located may be at least partially located within the orthographic projection of the first opening 31 on the plane where the substrate 10 is located. At the same time, the orthographic projection of each of the two concave surfaces on the plane where the substrate 10 is located may overlap the orthographic projection of the first opening 31 on the plane where the substrate 10 is located, and the orthographic projection of each of the two concave surfaces on the plane where the substrate 10 is located may overlap with the orthographic projection of the black matrix layer 30 on the substrate where the substrate 10 is located. Correspondingly, the area of the two adjacently arranged concave surfaces may be slightly larger than that of the first opening 31, such that the concave surfaces may be used to perform directional reflection on more light toward a region outside the first opening 31. Therefore, more reflected light may be absorbed by the black matrix layer 30, reducing or even eliminating the light emitted from the first opening 31 after being reflected by the first electrode layer 20. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

Figure 15:
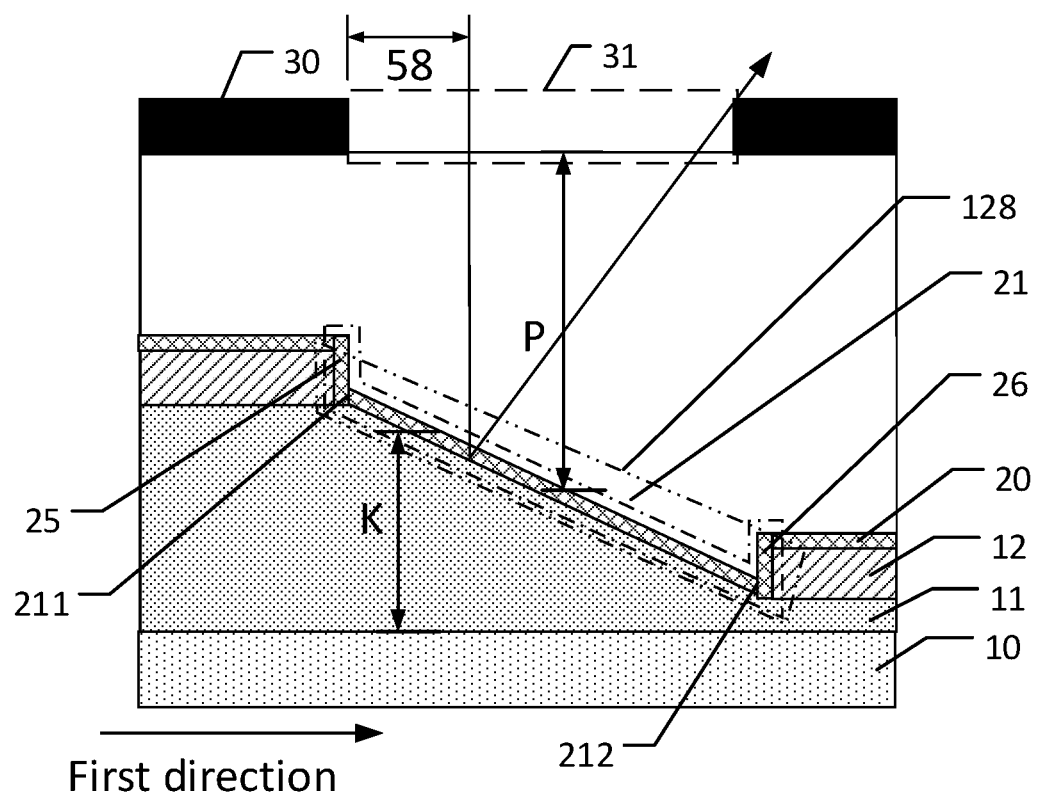
FIG. 15 illustrates another cross-sectional view of a region of the display panel in FIG. 2 along a CC' direction, consistent with various disclosed embodiments of the present disclosure.
Figure 16:
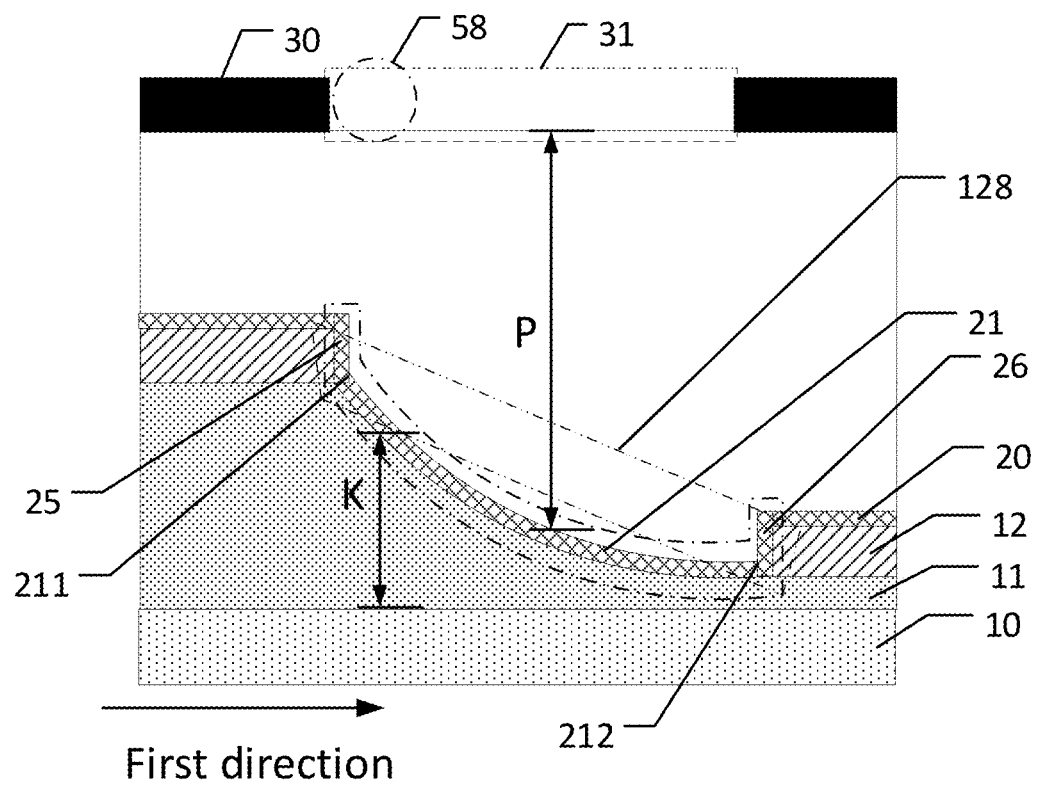
FIG. 16 illustrates another cross-sectional view of a region of the display panel in FIG. 2 along a CC' direction, consistent with various disclosed embodiments of the present disclosure.
Figure 17:
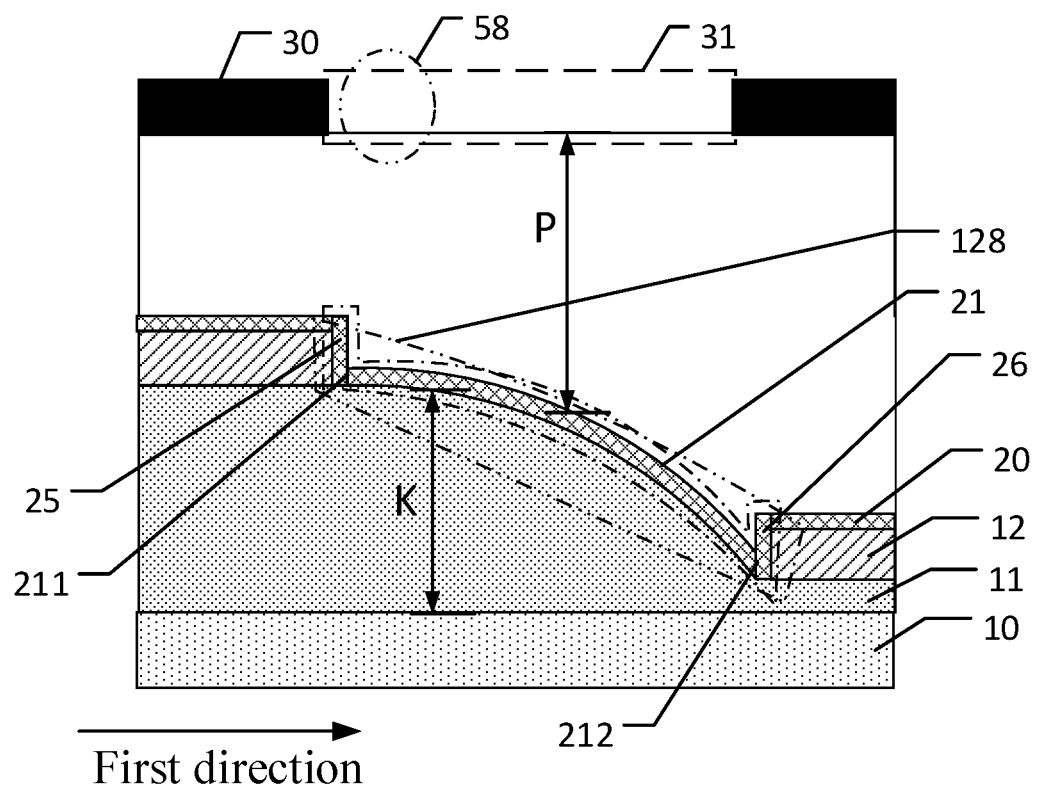
FIG. 17 illustrates another cross-sectional view of a region of the display panel in FIG. 2 along a CC' direction, consistent with various disclosed embodiments of the present disclosure.
Figure 18:
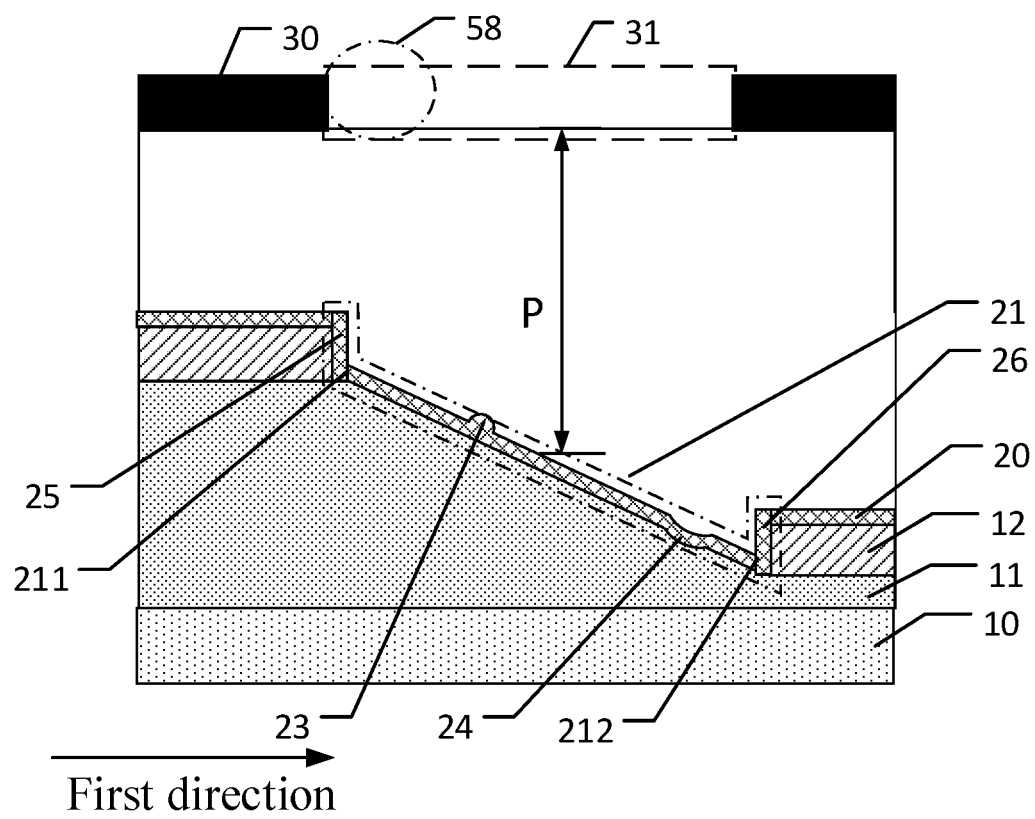
FIG. 18 illustrates another cross-sectional view of a region of the display panel in FIG. 2 along a CC' direction, consistent with various disclosed embodiments of the present disclosure.

FIG. 15 illustrates another cross-sectional view of a region of the display panel in FIG. 2 along a CC' direction, FIG. 16 illustrates another cross-sectional view of a region of the display panel in FIG. 2 along a CC' direction, FIG. 17 illustrates another cross-sectional view of a region of the display panel in FIG. 2 along a CC' direction, and FIG. 18 illustrates another cross-sectional view of a region of the display panel in FIG. 2 along a CC' direction. As shown in FIG. 1, FIG. 2, and FIG. 15 to FIG. 18, in a first direction, one first component 21 may include a first side 211 and a second side 212 opposite to each other. A vertical distance P between the first component 21 and the black matrix layer 30 in a direction from the first side 211 to the second side 212 may increase gradually. The first direction may be parallel to the direction of the plane of the substrate 10.

Specifically, in one embodiment, the first direction may be provided as a direction parallel to the plane where the substrate 10 is located. One first component 21 may include a first side 211 and a second side 212 opposite to each other. An extension direction of the plane where the first side 211 and the second side 212 are located may intersect the extension direction of the plane where the substrate 10 is located. Along the direction from the first side 211 to the second side 212 and a direction perpendicular to the plane where the substrate 10 is located, the vertical distance P between the first component 21 and the film layer where the black matrix layer 30 is located may gradually increase. That is, the plane where the first component 21 is located may intersect the plane where the substrate 10 is located.

That is, in the present embodiment, the surface of the first component 21 may be an inclined surface. The inclined surface may be used to reflect the ambient light incident from the first opening 31. Correspondingly, most of the light may not be emitted from the first opening 31 after being reflected by the first component 21. Instead, it may be reflected to the side surface of the black matrix layer 30 close to the first electrode layer 20 and may be absorbed by the black matrix layer 30, thereby reducing or even eliminating the light emitted from the first opening 31 after being reflected by the first electrode layer 20. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

As shown in FIG. 15, in one embodiment, the cross section of the inclined surface here may be a smooth straight line. In another embodiment shown in FIG. 16, the cross section of the inclined surface may show a curve recessed toward a side of the substrate 10. In another embodiment, as shown in FIG. 17, the cross section of the inclined surface may show a curve convex toward the side of the black matrix layer 30. In another embodiment shown in FIG. 18, the cross section of the inclined surface may be a generally smooth straight line that further includes several protrusions 23 and/or concaves 24, or a generally curve concave toward the side of the substrate 10 further including a plurality of protrusions and/or concaves (not shown), or a generally curve convex to the side of the black matrix layer 30 further including a plurality of protrusions and/or concaves (not shown). Therefore, the formed first component 21 may be used to reflect the ambient light incident from the first opening 31. Correspondingly, most of the light may not be emitted from the first opening 31 after being reflected by the first component 21. Instead, it may be reflected to the side surface of the black matrix layer 30 close to the first electrode layer 20 and may be absorbed by the black matrix layer 30, thereby reducing or even eliminating the light emitted from the first opening 31 after being reflected by the first electrode layer 20. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

Figure 19:
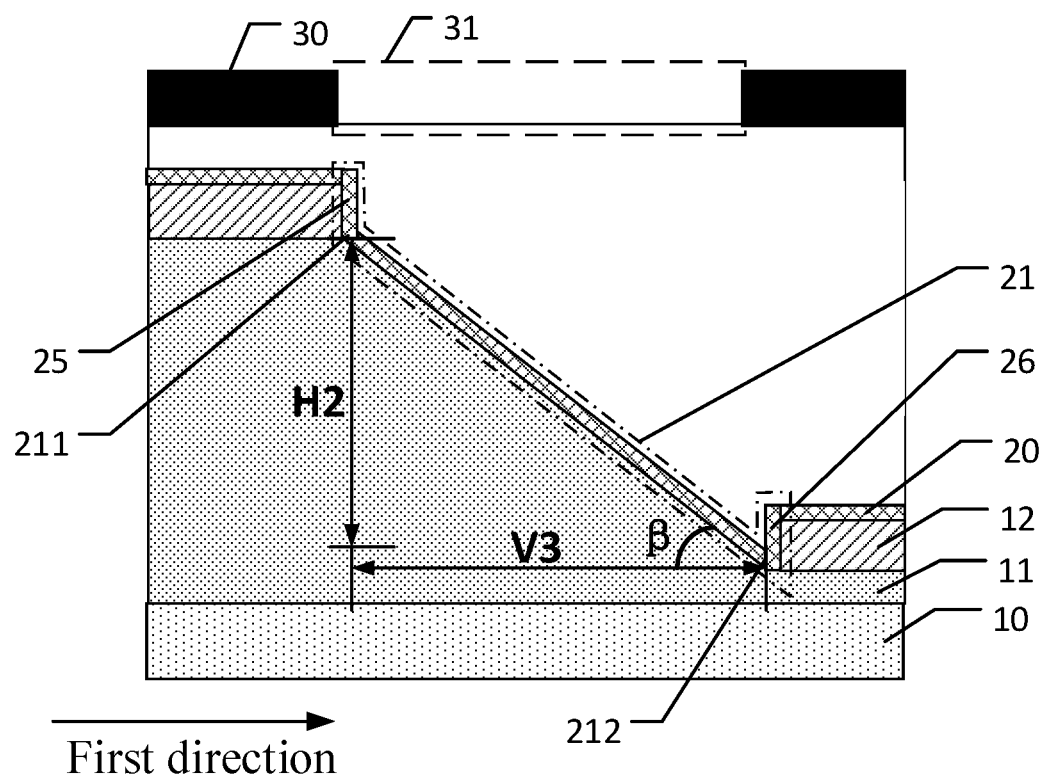
FIG. 19 illustrates another cross-sectional view of a region of the display panel in FIG. 2 along a CC' direction, consistent with various disclosed embodiments of the present disclosure.

FIG. 19 illustrates another cross-sectional view of a region of the display panel in FIG. 2 along a CC' direction. As shown in FIG. 1, FIG. 2, and FIG. 19, in one embodiment, a horizontal size of the inclined surface may be V3, and a vertical size of the inclined surface may be H2, where V3<H2.

Specifically, in one embodiment, the surface of the first component 21 may be the inclined surface. In a cross section of the inclined surface along a direction perpendicular to the plane of the substrate 10, the horizontal size may be V3, and the vertical size may be H2, where V3<H2.

Since the thickness H2 of the film layer for forming the inclined surface is limited, when the opening has a large horizontal size, the slope of the inclined surface may decrease and some light may be reflected and transmitted through the first opening 31, leading to a decrease in the technical effect. Therefore, in the present disclosure, it may be configured to V3<H2. Correspondingly, when the area of the light-transmitting hole (the first opening 31) is constant, the effect of reducing the reflection of ambient light from the outside by the display panel 100 may be improved.

As shown in FIG. 1, FIG. 2, and FIG. 19, in one embodiment, the angle between the inclined surface and the horizontal plane may be β satisfying [5°, 90°).

Specifically, in one embodiment, the surface of the first component 21 may include the inclined surface, and the angle β between the inclined surface and the horizontal plane may be larger than or equal to 5° and smaller than 90°. When the angle β between the inclined surface and the horizontal plane is smaller than 5°, it may be close to horizontal setup in existing arts, and most of the ambient light incident from the first opening 31 may still emit from the first opening and the amount of the reflected light emitted from the first opening 31 may not be significantly reduced. When the angle β between the inclined surface and the horizontal plane is 90°, the ambient light incident from the first opening 31 may not irradiate the surface of the first component 21, and a vertical structure may be formed between the first component 21 and the rest of the first electrode layer 20. Most of the ambient light incident from the first opening 31 may be transmitted to a rest part if the first electrode layer 20 arranged along the horizontal direction. The amount of reflected light emitted from the first opening 31 cannot be reduced.

Therefore, in the present embodiment, the angle β between the inclined surface and the horizontal plane may be larger than or equal to 5° and smaller than 90°. Correspondingly, most of the light may not be emitted from the first opening 31 after being reflected by the first component 21. Instead, it may be reflected to the side surface of the black matrix layer 30 close to the first electrode layer 20 and may be absorbed by the black matrix layer 30, thereby reducing or even eliminating the light emitted from the first opening 31 after being reflected by the first electrode layer 20. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

As shown in FIG. 1, FIG. 2, and FIG. 15 to FIG. 19, in one embodiment, the first electrode layer 20 may further include second components 25 and third components 26. One second component 25 may be connected to one corresponding first component 21 at the first side 211, and one third component 26 may be connected to one corresponding first component 21 at the second side 212. A height of the second component 25 may be larger than a height of the third component 26.

Specifically, in one embodiment, the first electrode layer 20 may further include the second components 25 and the third components 26. One second component 25 may be connected to one corresponding first component 21 at the first side 211, and one third component 26 may be connected to one corresponding first component 21 at the second side 212. In the direction perpendicular to the plane of the substrate 10, a height at which the second component 25 is disposed may be larger than a height a height at which the third component 26 is disposed. That is, a distance between the second component 25 and the plane where the substrate 10 is located may be larger than a distance between the third component 26 and the plane where the substrate 10 is located. Further, the second component 25 and the third component 26 may be disposed on the side of the first component 21 away from the plane where the substrate 10 is located. Therefore, the first component 21 may be located in a bottom surface of a concave surface, and may be used to reflect the ambient light incident from the first opening 31. Correspondingly, most of the light may not be emitted from the first opening 31 after being reflected by the first component 21. Instead, it may be reflected to the side surface of the black matrix layer 30 close to the first electrode layer 20 and may be absorbed by the black matrix layer 30, thereby reducing or even eliminating the light emitted from the first opening 31 after being reflected by the first electrode layer 20. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

Figure 20:
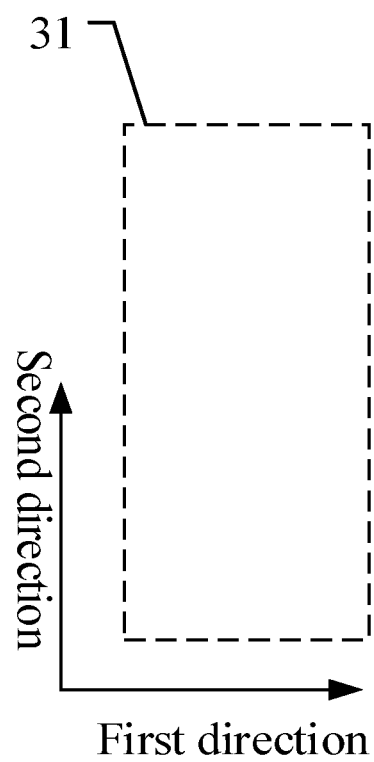
FIG. 20 illustrates a top view of a first opening consistent with various disclosed embodiments of the present disclosure.

FIG. 20 shows a top view of an exemplary first opening. As shown in FIG. 1, FIG. 2, and FIG. 20, in one embodiment, the first opening 31 may be a strip shape, and a longest dimension direction of the strip shape may be a second direction. The second direction may intersect with the first direction.

Specifically, in one embodiment, along the direction perpendicular to the plane where the substrate 10 is located, the orthographic projection of the first opening 31 on the plane where the substrate 10 is located may be a strip shape, besides a circle shown in FIG. 1 and FIG. 2. The strip shape here may specifically be a rectangle. For example, the aspect ratio of the rectangle may be 3:1 or 5:1, etc., rather than a relationship of 1:1. When the aspect ratio is 1:1, it will appear as a square, which is not a strip provided by the present disclosure.

In one embodiment, the longest dimension direction of the strip may be selected as the second direction, where the second direction may intersect with the first direction and the first direction is a direction parallel to the plane where the substrate 10 is located.

Figure 21:
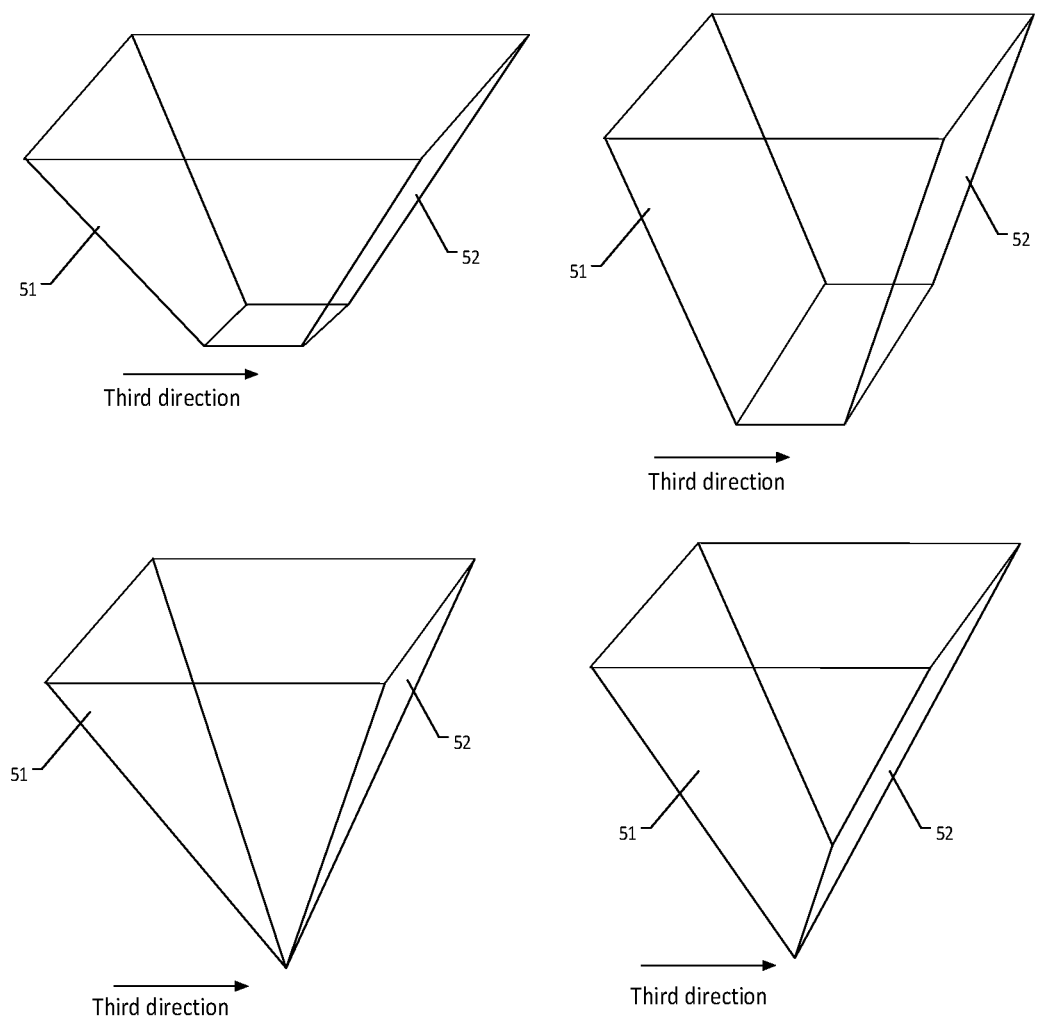
FIG. 21 illustrates four three-dimensional structures of a first component consistent with various disclosed embodiments of the present disclosure.

FIG. 21 shows four three-dimensional structural views of one first component provided by various embodiments of the present disclosure. As shown in FIG. 1 and FIG. 15 to FIG. 21, in one embodiment, the first component 21 includes a first inclined surface 51 and a second inclined surface 52 opposite to each other along a third direction.

Along the direction from the substrate 10 to the black matrix layer 30, the first inclined surface 51 and the second inclined surface 52 may be inclined toward a direction away from each other.

Specifically, in one embodiment, a top view of the first component 21 may be a rectangle, and the first component 21 may include a first inclined surface 51 and a second inclined surface 52 oppositely disposed along the third direction. Both planes where the first inclined surface 51 and the second inclined surface 52 are located may intersect with the plane where the substrate 10 is located. Along the direction from the substrate 10 to the black matrix layer 30, the first inclined surface 51 and the second inclined surface 52 may be inclined toward a direction away from each other. That is, in the direction perpendicular to the plane where the substrate 10 is located, the cross-section of the first component 21 may be a triangular structure. In one embodiment, the first component 21 may be formed by a recess toward a side of the first electrode layer 20 facing the substrate 10, the cross section of the first component 21 specifically may be an inverted triangular structure. Specifically, the recess formed by the first component 21 may be a triangular pyramid or a triangular prism as a whole. An inner surface of the triangular pyramid or triangular prism may be used to reflect the ambient light incident from the first opening 31. Correspondingly, most of the light may not be emitted from the first opening 31 after being reflected by the first component 21. Instead, it may be reflected to the side surface of the black matrix layer 30 close to the first electrode layer 20 and may be absorbed by the black matrix layer 30, thereby reducing or even eliminating the light emitted from the first opening 31 after being reflected by the first electrode layer 20. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

In another embodiment, the first component 21 may include a first inclined surface 51 and a second inclined surface 52 oppositely disposed along the third direction. Both planes where the first inclined surface 51 and the second inclined surface 52 are located may intersect with the plane where the substrate 10 is located. The first component 21 may further include a bottom surface parallel to the plane where the substrate 10 is located. The first inclined surface 51 and the second inclined surface 52 may both intersect with the bottom surface. Along the direction from the substrate 10 to the black matrix layer 30, the first inclined surface 51 and the second inclined surface 52 may be inclined toward a direction away from each other. That is, in the direction perpendicular to the plane where the substrate 10 is located, the cross-section of the first component 21 may be a trapezoidal structure. In one embodiment, the first component 21 may be formed by a recess toward a side of the first electrode layer 20 facing the substrate 10, the cross section of the first component 21 specifically may be an inverted trapezoidal structure. Specifically, the recess formed by the first component 21 may be a bucket shape as a whole. An inner surface of the bucket structure may be used to reflect the ambient light incident from the first opening 31. Correspondingly, most of the light may not be emitted from the first opening 31 after being reflected by the first component 21. Instead, it may be reflected to the side surface of the black matrix layer 30 close to the first electrode layer 20 and may be absorbed by the black matrix layer 30, thereby reducing or even eliminating the light emitted from the first opening 31 after being reflected by the first electrode layer 20. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

In another embodiment shown in FIG. 1 to FIG. 4, the first electrode layer 20 may include second components 27. One second component 27 may be parallel to the plane where the substrate 10 is located, and may be connected to one corresponding first component 21.

In a plane parallel to the substrate 10, a region where one first opening 21 is located may be within a region of one corresponding first component 21.

Specifically, in one embodiment of the present disclosure, the first electrode layer 20 may include second components 27. One second component 27 may be parallel to the plane where the substrate 10 is located, and may be connected to one corresponding first component 21. That is, the first electrode layer 20 may include the planar second components 27 and the non-planar first components 21. In the plane parallel to the substrate 10, the orthographic projection of one first opening 21 on the plane may be located within the orthographic projection of one corresponding first component 21 on the plane. Therefore, for one first component 21 and one corresponding first opening 31 stacked with each other, the orthographic projection of the first opening 21 may be located within the orthographic projection of the first component 21, and all the light incident from the first opening 31 may be transmitted to the non-planar surface of the first component, and then may be reflected by the non-planar surface of the first component. The non-planar surface may be used to reflect the ambient light incident from the first opening 31. Correspondingly, most of the light may not be emitted from the first opening 31 after being reflected by the first component 21. Instead, it may be reflected to the side surface of the black matrix layer 30 close to the first electrode layer 20 and may be absorbed by the black matrix layer 30, thereby reducing or even eliminating the light emitted from the first opening 31 after being reflected by the first electrode layer 20. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

As shown in FIG. 1 to FIG. 4, and FIG. 15 to FIG. 18, in one embodiment, an area of a reflective transmissible region 58 may be smaller than or equal to ¼ of a region of one corresponding first component 31.

Specifically, in one embodiment, the area of one reflective transmissible region 58 may be smaller than or equal to ¼ of a region of one corresponding first component 31. Therefore, the amount of the light reflected from the first opening 31 by the first electrode layer 20 may be small, reducing the reflectivity of the display panel 100.

The above embodiment where the area of one reflective transmissible region 58 may be smaller than or equal to ¼ of a region of one corresponding first component 31 is used as an example only to illustrate the present disclosure, and does not limit the scope of the present disclosure. In some other embodiments, the area of one reflective transmissible region 58 may be smaller than or equal to ½ or ⅓ of a region of one corresponding first component 31. The amount of the light reflected from the first opening 31 by the first electrode layer 20 may be reduced significantly, and the reflectivity of the display panel 100 may be reduced by about 50% to 30%.

Correspondingly, the amount of the light reflected from the first opening 31 by the first electrode layer 20 may be reduced. Therefore, most of the light may not be emitted from the first opening 31 after being reflected by the first component 21. Instead, it may be reflected to the side surface of the black matrix layer 30 close to the first electrode layer 20 and may be absorbed by the black matrix layer 30, thereby reducing or even eliminating the light emitted from the first opening 31 after being reflected by the first electrode layer 20. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

As shown in FIG. 1 to FIG. 4, in one embodiment, first recesses 123 may be provided on a side of the pixel definition layer 12 facing the black matrix layer 30. One first component 21 may cover an inner sidewall of one corresponding first recess 123.

Specifically, the present embodiment provides a configuration of the first components 21. In the present embodiment, the first recesses 123 may be disposed on a side surface of the pixel definition layer 12 facing the black matrix layer 30. That is, the pixel definition layer 12 may include the first recesses 123 toward a side facing the substrate 10. The first electrode layer 20 may cover inner sidewalls of the first recesses 123, to form the first components 21 located on the surfaces of the first recesses 123. That is, a portion of the first electrode layer 20 formed in the first recesses 123 of the pixel definition layer 12 may have non-planar structures to form the first components 21, and a remaining portion of the first electrode layer 20 on the surface of the pixel definition layer 12 may be a planar structure. The non-planar first components 21 may at least reflect a portion of the ambient light entering from one corresponding first opening 31 in different directions (not the direction toward the first opening 31), such that at least a part of the light may be reflected by the surface of the first component 21 to the surface of the black matrix layer 30 close to the first electrode layer 20 and be absorbed by the black matrix layer 30. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

Figure 22:
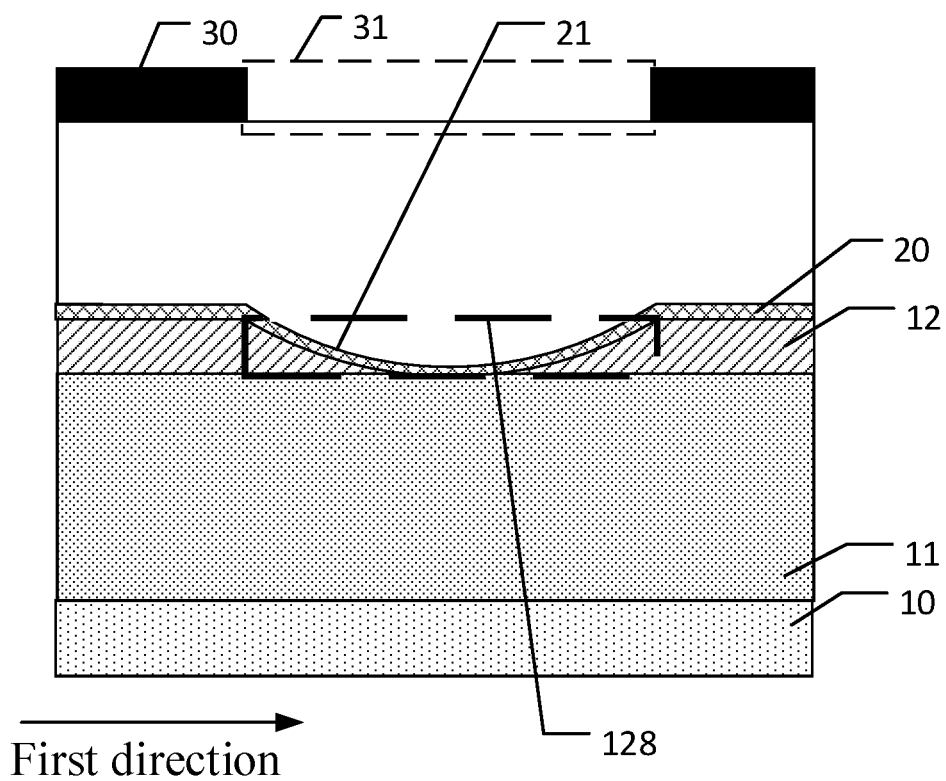
FIG. 22 illustrates another cross-sectional view of a region of the display panel in FIG. 2 along a CC' direction, consistent with various disclosed embodiments of the present disclosure.

FIG. 22 shows another cross-sectional view of the display panel in FIG. 2 along the CC' direction. As shown in FIG. 1 and FIG. 22, in one embodiment, second openings 128 may be formed in the pixel definition layer 12. The second openings 128 may expose the planarization layer 11.

One first component 21 may cover a sidewall of one corresponding second opening 128 and the planarization layer 11 exposed by the corresponding second opening 128.

Specifically, in the present embodiment, the second openings 128 may be disposed in the pixel definition layer 12. Along the direction perpendicular to the plane where the substrate 10 is located, the second openings 128 may penetrate through the whole pixel definition layer 12, to expose the planarization layer 11. Therefore, the non-planar surface formed by the first components may be more obvious, and the curvature or the inclination angle of the non-planar structure of the first components 21. Correspondingly, the non-planar first components 21 may reflect more ambient light from the first openings 31 into different directions (not the direction toward the first opening 31), and more light may be reflected to the surface of the black matrix layer 30 close to the first electrode layer 20 and be absorbed by the black matrix layer 30. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

When the cross section of the curved surface of one first component 21 is a semicircle or a minor arc, it may be equivalent to increasing the diameter of the semicircle or increasing the size of the major axis of the minor arc, thereby increasing the curvature or the inclination angle of the non-planar structure of the first component 21.

It should be noted that the second openings 128 provided in this embodiment may not damage the surface of the planarization layer 11, that is, the surface of the planarization layer 11 facing the pixel definition layer 12 may still be horizontal. The first components 21 in the first electrode layer 20 may be non-planar structures formed only in the pixel definition layer. One first component 21 may have a contact area with both the pixel definition layer 12 and the planarization layer 11.

It should also be noted that when forming recessed structures in the film layer structure, a halftone mask may be used. When forming an opening structure in the film layer structure, etching may be used.

Figure 23:
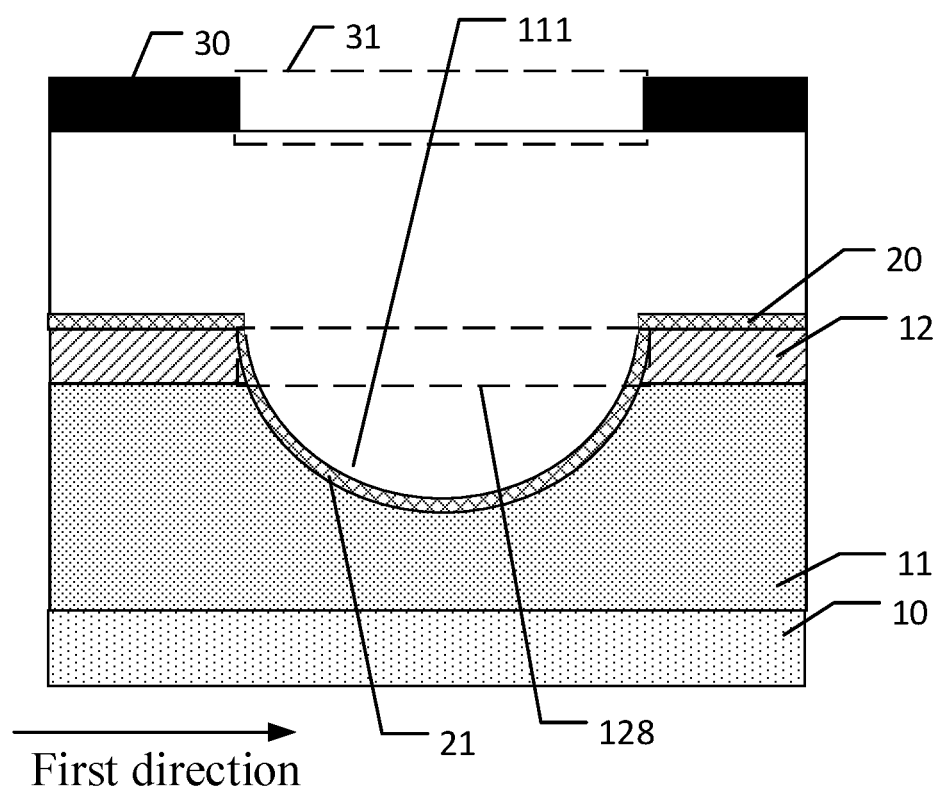
FIG. 23 illustrates another cross-sectional view of a region of the display panel in FIG. 2 along a CC' direction, consistent with various disclosed embodiments of the present disclosure.
Figure 24:
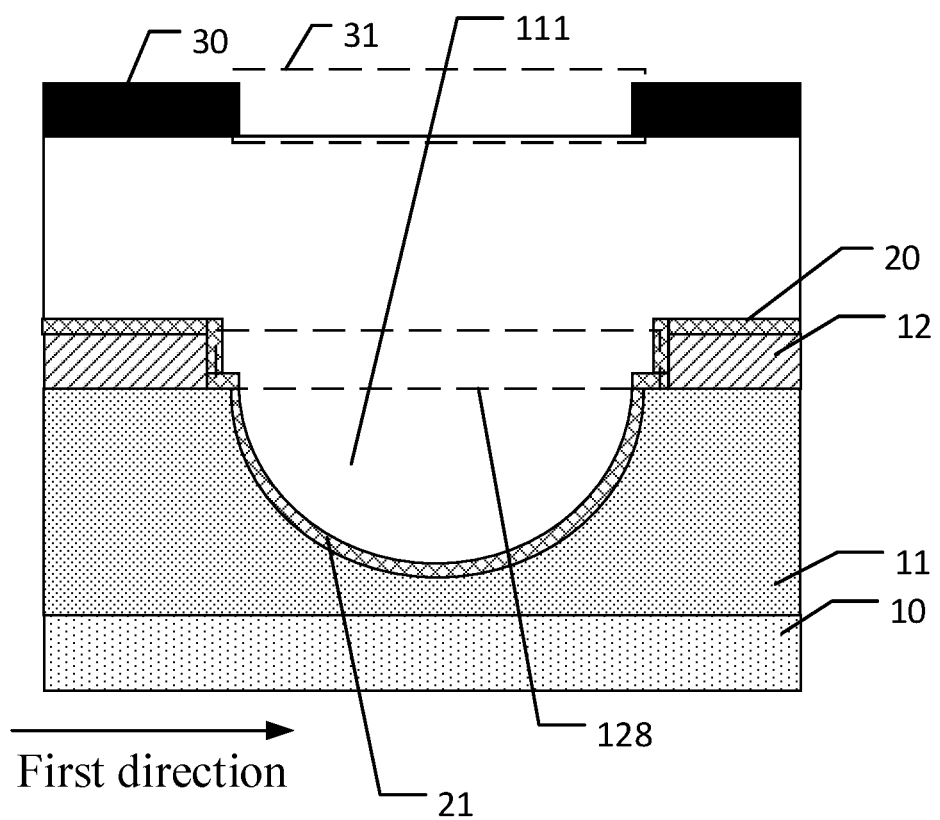
FIG. 24 illustrates another cross-sectional view of a region of the display panel in FIG. 2 along a CC' direction, consistent with various disclosed embodiments of the present disclosure.

FIG. 23 shows another cross-sectional view of the display panel in FIG. 2 along the CC' direction, and FIG. 24 shows another cross-sectional view of the display panel in FIG. 2 along the CC' direction. As shown in FIG. 1, FIG. 2, FIG. 23 and FIG. 24, in one embodiment, a portion of the planarization layer 11 exposed by one second opening 128 may be provided with a second recess 111. One corresponding first component 21 may cover the inner sidewall of the second recess 111.

Specifically, one second opening 128 may expose a portion of the planarization layer 11. The second recesses 111 may be formed in the planarization layer 11. One first component 21 in the first electrode layer 20 may cover the inner sidewall of one corresponding second recess 111, to achieve the formation of the first components 21 in the pixel definition layer and the planarization layer 11. Therefore, the non-planar surface formed by the first components may be more obvious, and the curvature or the inclination angle of the non-planar structure of the first components 21. Correspondingly, the non-planar first components 21 may reflect more ambient light from the first openings 31 into different directions (not the direction toward the first opening 31), and more light may be reflected to the surface of the black matrix layer 30 close to the first electrode layer 20 and be absorbed by the black matrix layer 30. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

The present disclosure has no limit the shape of the second recesses 111. In various embodiments, the shape of one second recess 111 may be a smooth spherical surface, or a stepped structure, etc., as long as the recess is able to be used to form the non-planar first component 21 to reduce the amount of light reflected to the corresponding first opening 31.

As shown in FIG. 1, FIG. 2, FIG. 23 and FIG. 24, in one embodiment, an opening of one second opening 128 toward the planarization layer 11 may be larger than or equal to an opening of one corresponding second recess 111 toward the pixel definition layer 12.

Specifically, an opening of one second opening 128 toward the planarization layer 11 may be larger than an opening of one corresponding second recess 111 toward the pixel definition layer 12. Therefore, one corresponding first component 21 with a stepped cross section may be formed. Or an opening of one second opening 128 toward the planarization layer 11 may be equal to an opening of one corresponding second recess 111 toward the pixel definition layer 12. Therefore, one corresponding first component 21 whose cross section is a smooth curved surface (including a spherical surface) or an inclined surface may be formed. Correspondingly, formation of the non-planar first components 21 in the pixel definition layer 12 and the planarization layer 11 may be achieved. Correspondingly, the non-planar first components 21 may be used to reflect the ambient light from the first openings 31 into different directions (not the direction toward the first opening 31), and more light may be reflected to the surface of the black matrix layer 30 close to the first electrode layer 20 and be absorbed by the black matrix layer 30. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

Figure 25:
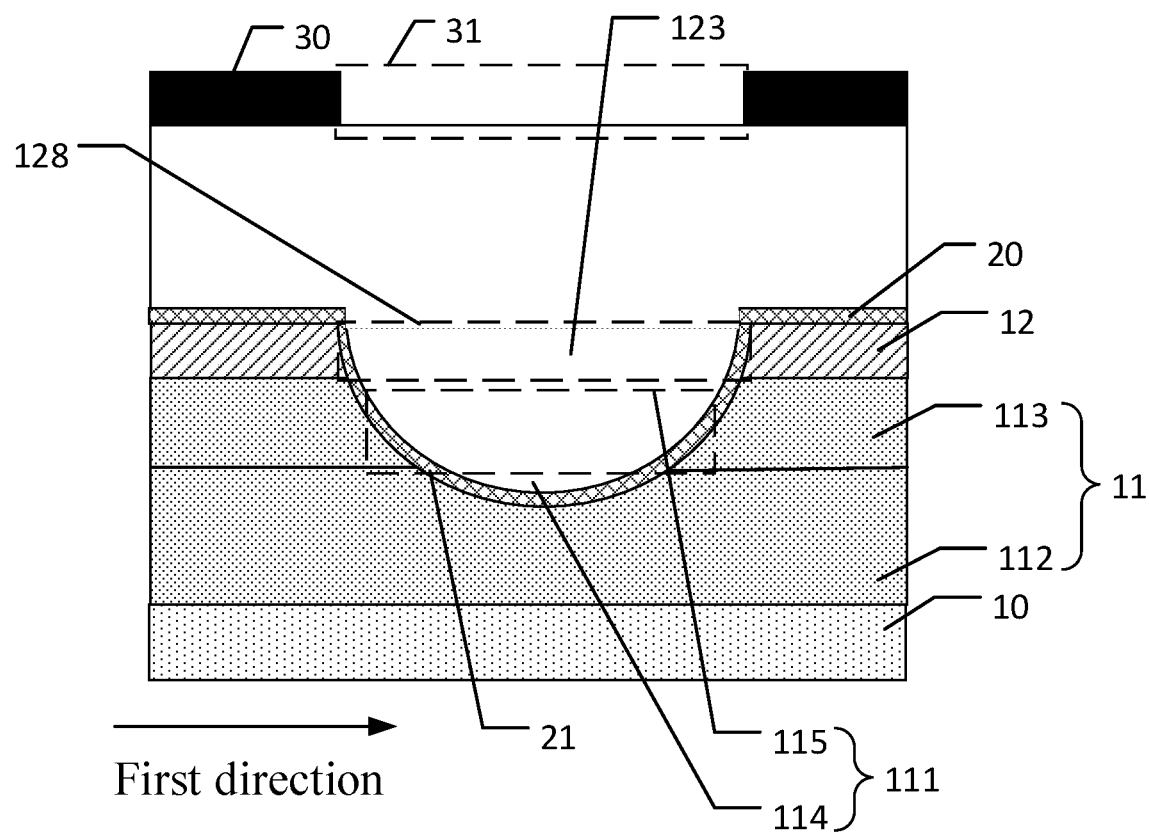
FIG. 25 illustrates another cross-sectional view of a region of the display panel in FIG. 2 along a CC' direction, consistent with various disclosed embodiments of the present disclosure.

FIG. 25 shows another cross-sectional view of the display panel in FIG. 2 along the CC' direction. As shown in FIG. 1, FIG. 2, and FIG. 25, in one embodiment, the planarization layer 11 may include a first planarization layer 112 and a second planarization layer 113 which are stacked. The first planarization layer 112 may be disposed on a side of the second planarization layer 113 close to the substrate 10.

The first planarization layer 112 may be provided with third recesses 114, and the second planarization layer 113 may be provided with third openings 115. One second recess 111 may be formed by one corresponding third opening 115 and one corresponding third recess 114.

Specifically, the planarization layer 11 may include the first planarization layer 112 and the second planarization layer 113 which are stacked instead of one single layer. The first planarization layer 112 may be disposed on a side of the second planarization layer 113 close to the substrate 10. When the pixel definition layer 12 includes the first recesses 123, the first planarization layer 112 may be provided with the third recesses 114, and the second planarization layer 113 may be provided with the third openings 115. One second recess 111 in the planarization layer 11 (the first planarization layer 112 and the second planarization layer 113) may be formed by one corresponding third opening 115 and one corresponding third recess 114. Therefore, the first components 21 may be formed on the surfaces of recessed structures formed by the first planarization layer 112, the second planarization layer 113, and the pixel definition layer together, and a fabrication depth of the first components 21 may be increased. Therefore, the non-planar surface formed by the first components may be more obvious, and the curvature or the inclination angle of the non-planar structure of the first components 21. Correspondingly, the non-planar first components 21 may reflect more ambient light from the first openings 31 into different directions (not the direction toward the first opening 31), and more light may be reflected to the surface of the black matrix layer 30 close to the first electrode layer 20 and be absorbed by the black matrix layer 30. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

As shown in FIG. 1, FIG. 2, and FIG. 15 to FIG. 17, in one embodiment, along the first direction, a thickness K of a portion of the planarization layer 11 exposed by one second opening 128 may decrease gradually.

Specifically, along the first direction, a thickness K of a portion of the planarization layer 11 exposed by one second opening 128 may decrease gradually. That is, a cross section of the structure of the second opening 128 in the planarization layer 11 may be an inclined surface or an inclined curved surface, as described above. The inclined surface of the inclined curved surface may be used to reflect light incident on the surface of one corresponding first component 21 disposed on its surface, and more light may be reflected to the surface of the black matrix layer 30 close to the first electrode layer 20 and be absorbed by the black matrix layer 30. Correspondingly, the light emitted from the first opening 31 after being reflected by the first component 21 of the first electrode layer 20 may be reduced or eliminated, reducing or avoiding influence on the overall display effect of the display panel 100 of the reflected light. The display uniformity of the display panel 100 may be improved to ensure the user experience.

The planarization layer 11 may be a single-layer structure, or may be a two-layer structure including two stacked planarization sub-layers such as a first planarization layer 112 and a second planarization layer 113 that are stacked. The first planarization layer 112 may be disposed on the side of the second planarization layer 113 close to the substrate 10. Therefore, when the first planarization layer 112 and the second planarization layer 113 are included, the second openings 128 may penetrate through at least a portion of the second planarization layer 113, or may penetrate through the entire second planarization layer 113 and at least a portion of the first planarization layer 112. The present disclosure has no specific limit on this, as long as the exposed portion exposed by one second opening 128 is able to be used for the fabrication of one corresponding non-planar first component 21.

The thickness K of the single-layer planarization layer 11 may be in the range of 1.5 μm-2 μm. When the planarization layers 11 includes a plurality of stacked planarization sub-layers, the thickness K of the entire planarization layer 11 may be in the range of 3 μm-6 μm. When the thickness K of the planarization layer 11 is too small, it may be not easy to control the process during production, and also difficult to form a relatively obvious non-planar structure. When the thickness K of the planarization layer 11 is too large, it may be easy to cause the increase of the thickness of the entire display panel 100, which may be not beneficial to the thin design of the display panel 100. The above-mentioned setting scheme for the thickness K of the planarization layer 11 is only an optional setting interval provided by the present disclosure, and does not limit the scope of the present disclosure. Users may adjust the fabrication thickness K of the planarization layer 11 in the display panel 100 according to actual design requirements.

As shown in FIG. 1 to FIG. 4, the display panel 100 may further include an encapsulation layer 40 between the first electrode layer 20 and the black matrix layer 30, and the encapsulation layer 40 may be in contact with the first components 21.

The first components 21 may be in contact with the pixel definition layer 12, and an absolute value of a difference between the refractive index of the encapsulation layer 40 and the refractive index of the pixel definition layer 12 may be less than or equal to 0.5.

In another embodiment, the first components 21 may be in contact with the pixel definition layer 12 and the planarization layer 11, and an absolute value of a difference between the refractive index of the encapsulation layer 40 and the refractive index of the pixel definition layer 12 and an absolute value of a difference between the refractive index of the encapsulation layer 40 and the refractive index of the planarization layer 11 may be less than or equal to 0.5.

Specifically, the display panel 100 may further include an encapsulation layer 40 between the first electrode layer 20 and the black matrix layer 30, and the encapsulation layer 40 may be in contact with the first components 21. That is, the encapsulation layer 40 may fill between the first electrode layer 20 and the black matrix layer 30.

In one embodiment, the first components 21 may be in contact with the pixel definition layer 12, and an absolute value of a difference between the refractive index of the encapsulation layer 40 and the refractive index of the pixel definition layer 12 may be less than or equal to 0.5. Since the first components 21 may include a shape including a curved surface, the above relationship between the refractive index of the encapsulation layer 40 and the refractive index of the pixel definition layer 12 may prevent the shape of the first components 21 from focusing the light for fingerprint detection, to avoid the influence on the accuracy of the fingerprint detection.

In another embodiment, the first components 21 may be in contact with the pixel definition layer 12 and the planarization layer 11, and an absolute value of a difference between the refractive index of the encapsulation layer 40 and the refractive index of the pixel definition layer 12 and an absolute value of a difference between the refractive index of the encapsulation layer 40 and the refractive index of the planarization layer 11 may be less than or equal to 0.5. Since the first components 21 may include a shape including a curved surface, the above relationship between the refractive index of the encapsulation layer 40 and the refractive index of the pixel definition layer 12 may prevent the shape of the first components 21 from focusing the light for fingerprint detection, to avoid the influence on the accuracy of the fingerprint detection.

The encapsulation layer 40 may be a stacked structure including an inorganic layer, an organic layer, and another inorganic layer. For example, the encapsulation layer 40 may include a first encapsulation layer 40, a second encapsulation layer 40 and a third encapsulation layer 40 that are stacked. The second encapsulation layer 40 may be sandwiched between the first encapsulation layer 40 and the third encapsulation layer 40. The first encapsulation layer 40 and the third encapsulation layer 40 may be made of inorganic materials, and the second encapsulation layer 40 may be made of organic materials including organic nanoparticles. The inorganic material may include silicon nitride or silicon oxynitride. For example, the first encapsulation layer 40 and the third encapsulation layer 40 may both be made of silicon nitride or silicon oxynitride. In another embodiment, the first encapsulation layer 40 may be made of one of silicon nitride or silicon oxynitride, and the third encapsulation layer 40 may be made of another one of silicon nitride or silicon oxynitride. Organic materials may include polymethyl methacrylate (PMMA) and/or methyl methacrylate (MMA), and the organic nanoparticles may include polystyrene-polynitrogen-isopropylacrylamide nanoparticles (PS-PNIPAm NPs) and/or polymethyl methacrylate nanoparticles (PMMA NPs). For example, the organic nanoparticles may include polystyrene-polynitrogen-isopropylacrylamide nanoparticles and/or polymethyl methacrylate nanoparticles when the organic materials include polymethyl methacrylate; or the organic nanoparticles may include polymethyl methacrylate nanoparticles when the organic materials include methyl methacrylate.

When forming the display panel 100, an inorganic layer may be in contact with cathodes of light-emitting elements in the display panel 100. The inorganic layer may be configured to have a refractive index in the range of 1.9-2, to make the light-emitting effect of the light-emitting elements more stable and avoid the influence of the inorganic layer on the display effect. It should be noted that the above-mentioned range of values for the refractive index of the inorganic layer in contact with the cathodes is only an optional setting interval, and the present disclosure has no limit on this. Users may adjust the refractive index of the inorganic layer according to the actual situation.

Figure 26:
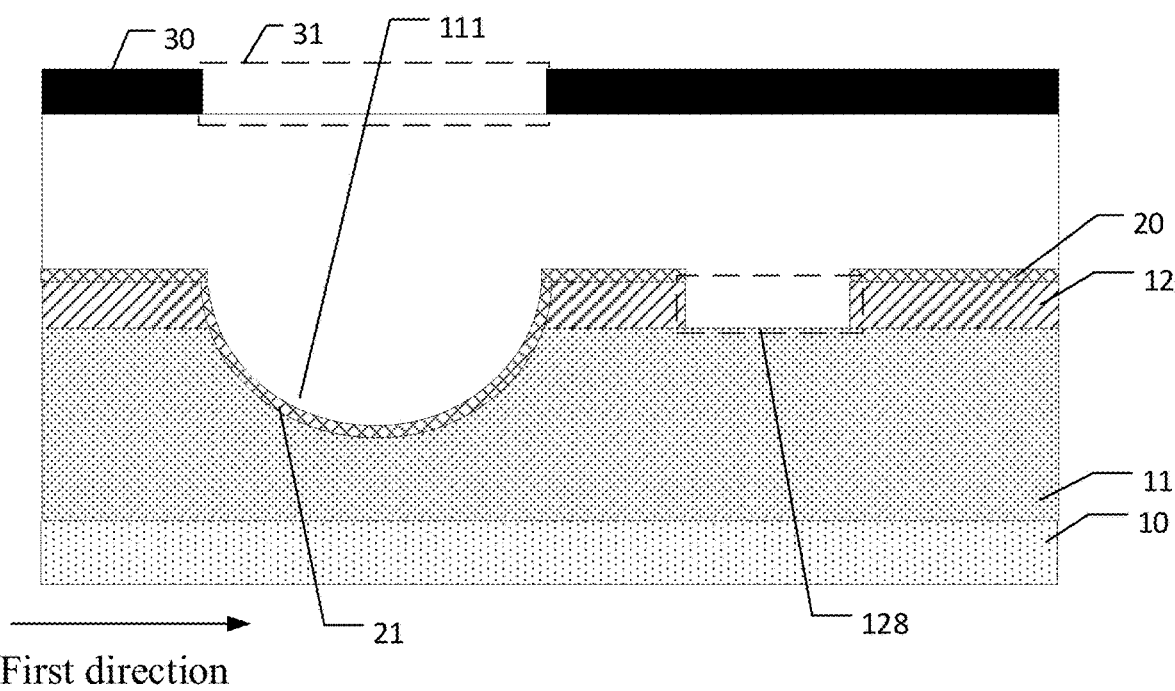
FIG. 26 illustrates another cross-sectional view of a region of the display panel in FIG. 2 along a CC' direction, consistent with various disclosed embodiments of the present disclosure.

FIG. 26 shows another cross-sectional view of the display panel in FIG. 2 along the CC' direction. As shown in FIG. 1 and FIG. 26, in one embodiment, the pixel definition layer 12 may be made of a material including a light-absorption material.

The pixel definition layer 12 may be provided with second openings 128. The second openings 128 may not overlap the first openings 31.

Specifically, the second openings 128 may be provided in the pixel definition layer 12. Along the direction perpendicular to the plane where the substrate 10 is located, the orthographic projections of the second openings 128 on the plane where the substrate 10 is located may not overlap the orthographic projections of the first openings 31 on the planes where the substrate 10 is located. At this time, a light-absorbing material may be used to make the pixel definition layer 12. The second openings 128 may be used to transmit optical signals for detection, such as fingerprint recognition, light touch, etc. The second openings 128 may also be used to transmit light from the back side of the display panel 100 to form a transparent display and the like. The second openings 128 may also be used to collect the oblique light incident from the first openings 31, and part of the light may be absorbed by the pixel definition layer 12 to reduce the reflectivity of the display panel 100.

When the FOD needs to collect oblique light, the second openings 128 staggered from the position of the first openings 31 may be used to ensure light transmission. At the same time, the first electrode layer 20 (the first components 21) at the corresponding position of the recesses may be not parallel to the plane where the substrate 10 is located. After the light is reflected by the first components 21, the light path may change, such that the reflected light is blocked by the black matrix layer 30, to reduce the light emitted from the first openings 31 and reduce the reflectivity. It should be supplemented that the first electrode layer 20 may be not provided in the regions where the second openings 128 are located.

Figure 27:
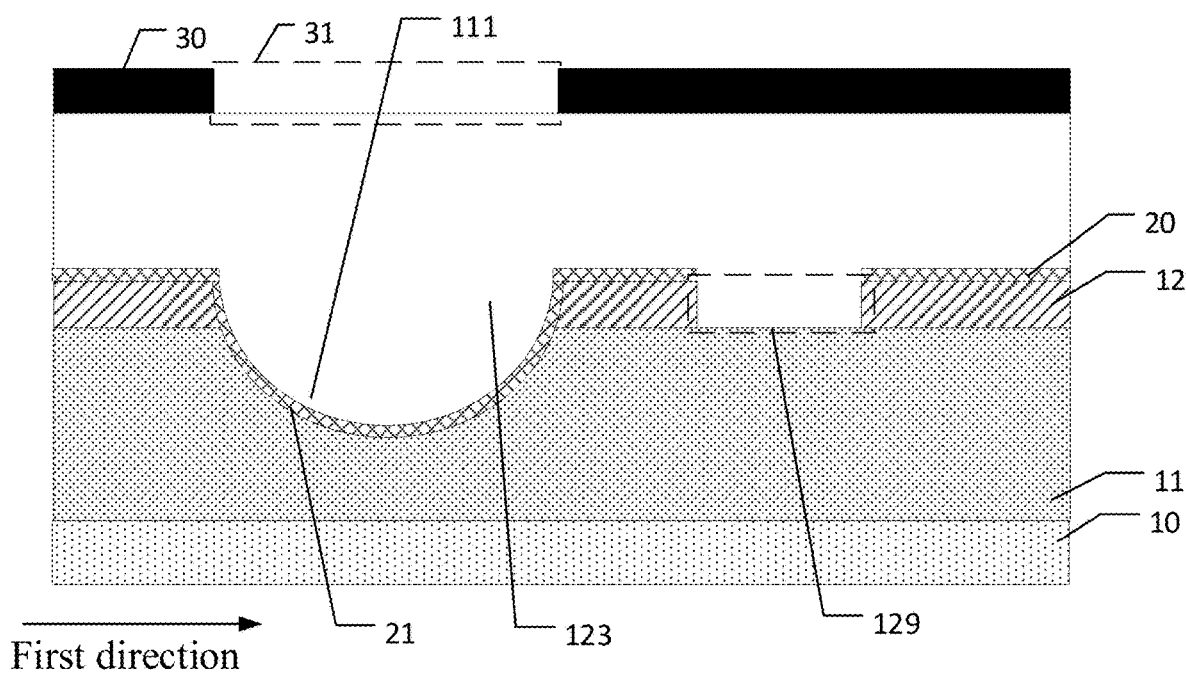
FIG. 27 illustrates another cross-sectional view of a region of the display panel in FIG. 2 along a CC' direction, consistent with various disclosed embodiments of the present disclosure.

FIG. 27 shows another cross-sectional view of the display panel in FIG. 2 along the CC' direction. As shown in FIG. 1 and FIG. 27, in one embodiment, the pixel definition layer 12 may be made of a material including a light-absorption material.

The pixel definition layer 12 may be provided with fourth openings 129. The fourth openings 129 may not overlap the first openings 31.

First recesses 123 may be provide on a side of the pixel definition layer 12 facing the black matrix layer 30. One first portion 21 may cover an inner sidewall of one corresponding first recess 123.

Specifically, the fourth openings 129 may be provided in the pixel definition layer 12. Along the direction perpendicular to the plane where the substrate 10 is located, the orthographic projections of the fourth openings 129 on the plane where the substrate 10 is located may not overlap the orthographic projections of the first openings 31 on the planes where the substrate 10 is located. At this time, a light-absorbing material may be used to make the pixel definition layer 12. The first recesses 123 may be provide on a side of the pixel definition layer 12 facing the black matrix layer 30. The first recesses 123 may be formed by removing a portion of the thickness of a side surface of the pixel definition layer 12 facing the black matrix layer 30. In another embodiment, the first recesses 123 may be formed by providing recesses in the planarization layer 11, and the structure of the first recesses 123 may be formed naturally when the pixel definition layer 12 is formed on the recesses of the planarization layer 11. Correspondingly, in the first electrode layer 20 disposed on the side of the pixel definition layer 12 facing the black matrix layer 30, one first portion 21 may cover an inner sidewall of one corresponding first recess 123 to form the non-planar first component 21.

The fourth openings 129 may be used to transmit optical signals for detection, such as fingerprint recognition, light touch, etc. The second openings 128 may also be used to transmit light from the back side of the display panel 100 to form a transparent display and the like. The second openings 128 may also be used to collect the oblique light incident from the first openings 31, and part of the light may be absorbed by the pixel definition layer 12 to reduce the reflectivity of the display panel 100.

When the FOD needs to collect oblique light, the fourth openings 129 staggered from the position of the first openings 31 may be used to ensure light transmission. At the same time, the first electrode layer 20 (the first components 21) at the corresponding position of the recesses may be not parallel to the plane where the substrate 10 is located. After the light is reflected by the first components 21, the light path may change, such that the reflected light is blocked by the black matrix layer 30, to reduce the light emitted from the first openings 31 and reduce the reflectivity.

The thickness of the first recesses 123 may occupy at least a portion of the thickness of the pixel definition layer 12, or occupy the whole thickness of the pixel definition layer. The present disclosure has no limit on this and users may select according to actual needs.

Figure 28:
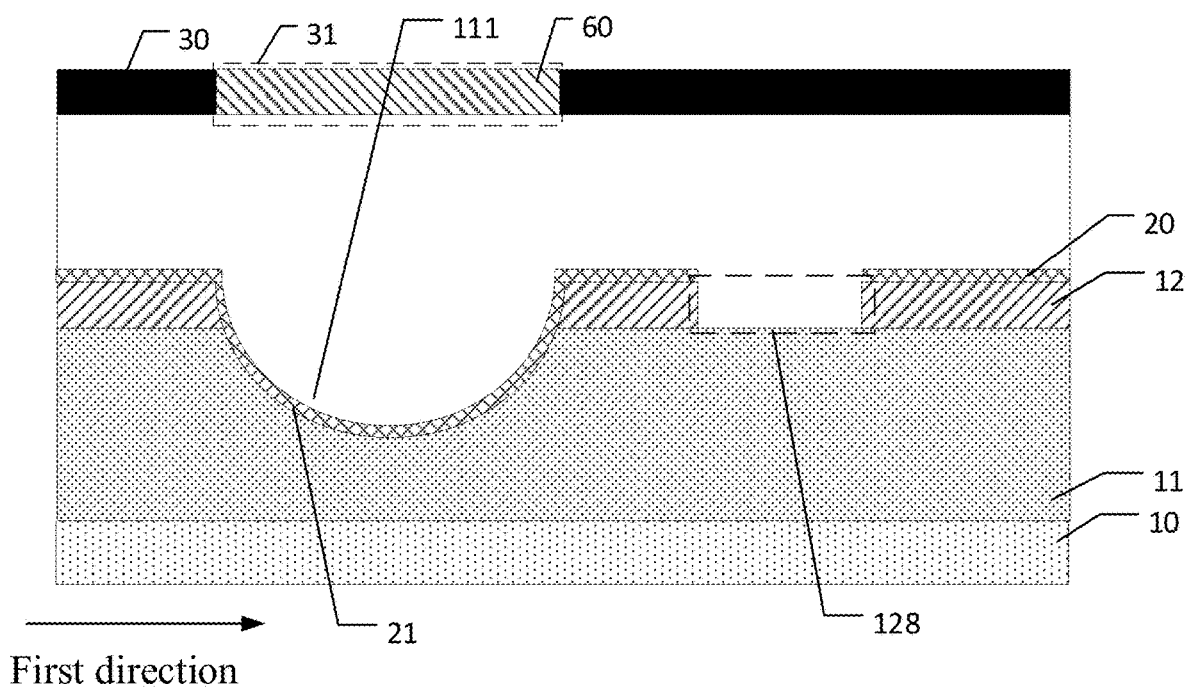
FIG. 28 illustrates another cross-sectional view of a region of the display panel in FIG. 2 along a CC' direction, consistent with various disclosed embodiments of the present disclosure.

FIG. 28 shows another cross-sectional view of the display panel in FIG. 2 along the CC' direction. As shown in FIG. 1 and FIG. 28, in one embodiment, the display panel may further include a color-blocking layer.

The color-blocking layer may include a plurality of color blockers 60. The plurality of color blockers 60 may fill the first openings 31.

Specifically, the display panel 100 may further include a color-blocking layer, and the color-blocking layer may include a plurality of color blockers 60. At least a portion of the plurality of color blockers 60 may be filled in the first openings 31 of the black matrix layer 30. One of the plurality of color blockers 60 covering one first opening 30 may have a color different from the color of the remaining pixels swept along the reflection direction. At this time, the light incident through the first opening 31 may be reflected by the corresponding first component 21, and the reflected light may pass through the color blocker 60 filled in the first opening 31 and one conventionally arranged color blocker 60. That is, the reflected light may pass through two different color blockers 60, and the transmittance of the reflected light may be greatly reduced.

Figure 29:
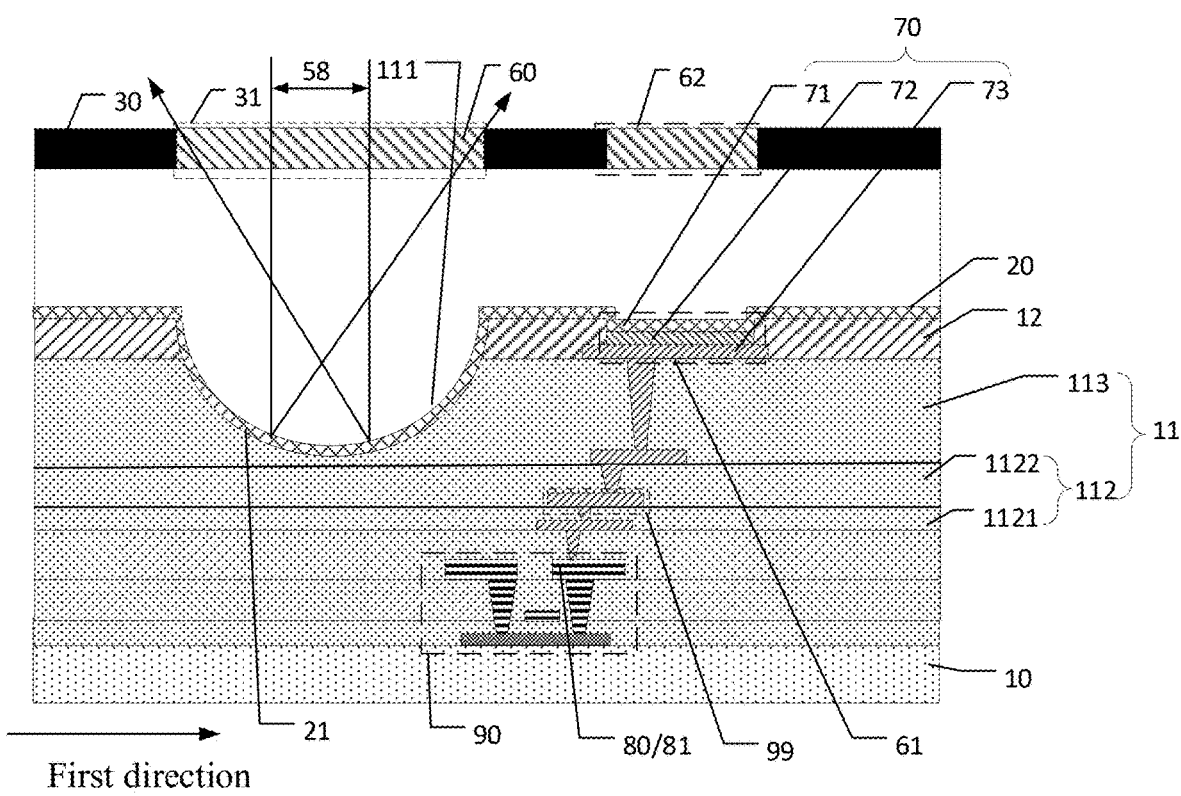
FIG. 29 illustrates another cross-sectional view of a region of the display panel in FIG. 2 along a CC' direction, consistent with various disclosed embodiments of the present disclosure.

FIG. 29 shows another cross-sectional view of the display panel in FIG. 2 along the CC' direction. As shown in FIG. 1 and FIG. 29, in one embodiment, the display panel may further include light-emitting elements 70.

The pixel definition layer 12 may include fifth openings 61, and the light-emitting elements 70 may be disposed in the fifth openings 61.

The black matrix layer 30 may include sixth openings 62, and the sixth openings 62 may overlap the light-emitting elements 70.

The sixth openings 62 may be filled with color blockers 60.

The color blockers filled in one first opening 31 and one adjacent sixth opening 62 respectively may have different colors.

Specifically, the display panel may further include the light-emitting elements 70. The pixel definition layer 12 may be provided with the fifth openings 61, and the light-emitting elements 70 may be disposed in the fifth openings 61. The black matrix layer 30 may include the sixth openings 62. In the direction perpendicular to the plane where the substrate 10 is located, the orthographic projections of the sixth openings 62 on the plane where the substrate 10 is located may overlap the orthographic projections of the light-emitting elements 70 on the plane where the substrate 10 is located, such that the light emitted by the light-emitting elements 70 may be emitted from the sixth openings 62 to realize the normal display function of the display panel 100.

Further, the sixth openings 62 may be filled with the color blockers 60. The color blockers filled in one first opening 31 and one adjacent sixth opening 62 respectively may have different colors, to realize the display of various colors through the combination of different colors. The light incident through one first opening 31 may be reflected by one corresponding first component 21, and the reflected light may pass through the color blocker 60 filled in the first opening 31 and the color blocker 60 filled in one corresponding sixth opening 62. That is, the reflected light may pass through two different color blockers 60, and the transmittance of the reflected light may be greatly reduced.

The display panel 100 may further include driving transistors 90 for controlling whether an electrical signal can be transmitted to the light-emitting elements 70, to control whether the light-emitting elements 70 is in a light-emitting state or an extinguishing state.

As shown in FIG. 1 and FIG. 29, in one embodiment, the display panel 100 may further include light-emitting elements 70 and a metal layer 80.

One light-emitting element 70 may include a first electrode 71, a light-emitting layer 72 and a second electrode 73. The light-emitting layer 72 may be located between the first electrode 71 and the second electrode 73. The first electrode 71 may be disposed in the first electrode layer 20, and the second electrode 73 may be is located on the side of the first electrode 71 close to the substrate 10.

The metal layer 80 may include a connection electrode 81.

The pixel definition layer may be provided with fifth openings 61, and the light-emitting elements 70 may be disposed in the fifth openings 61.

The planarization layer 11 may include a first planarization layer 112 and a second planarization layer 113 that are stacked. The first planarization layer 112 may be located on a side of the second planarization layer 113 close to the substrate 10.

The metal layer 80 may be located between the first planarization layer 112 and the second planarization layer 113. The connection electrode 81 may be electrically connected to the second electrode 73 through a via hole in the second planarization layer 113.

Specifically, the display panel 100 may include the light-emitting elements 70, and one light-emitting element 70 may be formed by the first electrode 71, the light-emitting layer 72 and the second electrode 73. The light-emitting layer 72 may be disposed between the first electrode 71 and the second electrode 73. The first electrode 71 may be disposed in the first electrode layer 20, the second electrode 73 may be disposed in the second electrode layer, and the second electrode layer may be located on the side of the first electrode layer 20 close to the substrate 10.

The display panel 100 may further include the planarization layer 11. The planarization layer 11 may include a first planarization layer 112 and a second planarization layer 113 that are stacked. The first planarization layer 112 may be located on a side of the second planarization layer 113 close to the substrate 10. The first planarization layer 112 may include a first sub-planarization layer 1121 and a second sub-planarization layer 1122 that are stacked. The metal layer may be provided between the first planarization layer 112 and the second planarization layer 113 and between the first sub-planarization layer 1121 and the second sub-planarization layer to form structures such as signal lines, power lines, or transfer structures 99, etc. The recesses corresponding to the first components 21 may include recesses formed on the second planarization layer 113, or recesses formed together on the second planarization layer 113 and the second sub-planarization layer 1122, or recesses formed on the second planarization layer 113, the second sub-planarization layer 1122 and the first sub-planarization layer 1121. The depth or size of the concave first components 21 may be set according to requirements.

The display panel 100 may further include the pixel definition layer 12, and the fifth openings 61 may be formed in the pixel definition layer 12. The light-emitting elements 70 may be disposed in the fifth openings 61. The plurality of light-emitting elements 70 may be used to form a light-emitting surface of the display panel 100, to realize the display function.

The film layer between the black matrix layer 30 and the first electrode layer 20 may be equivalent to the encapsulation layer in the display panel of the related art. The encapsulation layer may be formed by an inorganic insulating layer, an organic insulating layer, and another inorganic insulating layer that are stacked, and may be denoted as thin film encapsulation (TFE).

Figure 30:
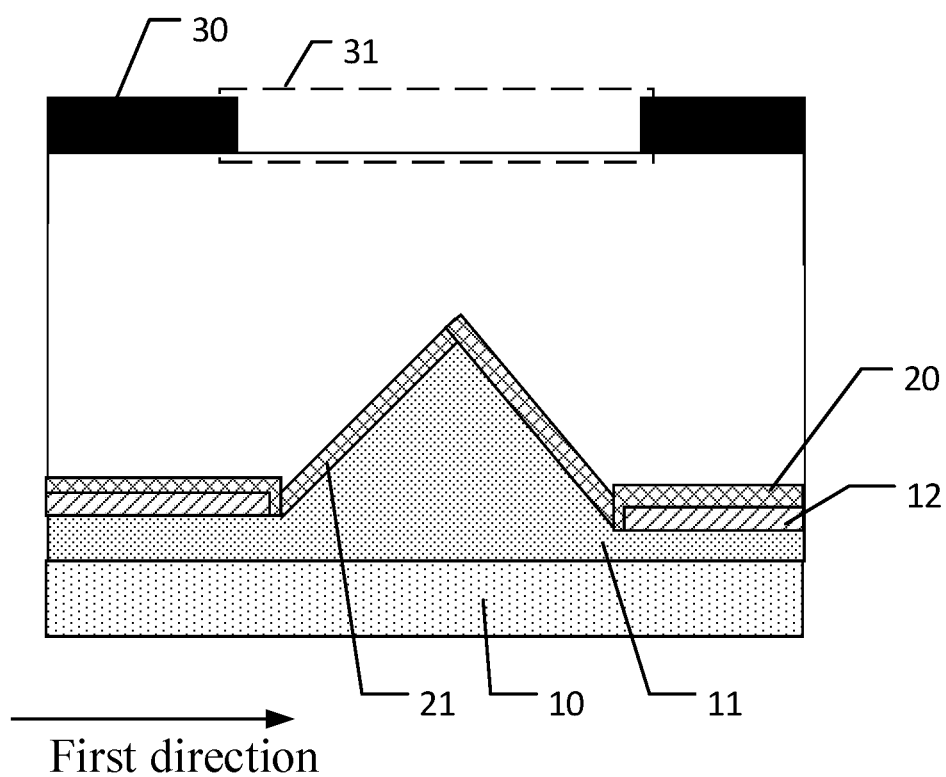
FIG. 30 illustrates another cross-sectional view of a region of the display panel in FIG. 2 along a CC' direction, consistent with various disclosed embodiments of the present disclosure.

FIG. 30 shows another cross-sectional view of the display panel in FIG. 2 along the CC' direction. As shown in FIG. 1 and FIG. 30, different from above embodiments where the non-planar structure is formed by a recess of one first component 21 toward a side facing the substrate 10, in the present embodiment, the non-planar structure may be formed by a recess of one first component 21 toward a side away from the substrate 10. The present disclosure has no limit on this.

Figure 31:
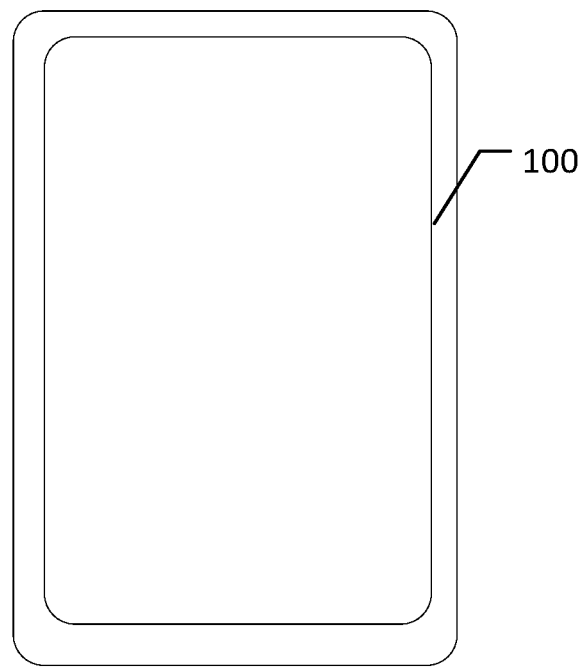
FIG. 31 illustrates an exemplary display device consistent with various disclosed embodiments of the present disclosure.

The present disclosure also provides a display device. As shown in FIG. 31, in one embodiment, the display device 200 may include any display panel 100 provided by various embodiments of the present disclosure.

The display device may further include an optical sensing device such as a fingerprint recognition unit. The fingerprint recognition unit or the optical sensing device may be integrated into the display panel 100, or may be disposed on a back side of the display panel through an external manner. The present disclosure does not specifically limit it.

It should be noted that, for the embodiments of the display device 200 provided by the embodiments of the present disclosure, reference may be made to the embodiments of the display panel 100 described above which are repeatedly pointed out and will not be repeated. The display device 200 provided in the present disclosure may be any product or component with touch function, such as a mobile phone, a tablet computer, a television, a touch controller, a notebook computer, a navigator, and the like.

In the present disclosure, the black matrix layer in the display panel may be provided with the first openings. The first electrode layer may be provided with the first components. The surface of one first component of the first electrode layer may be non-planar, such that when the light incident from the first opening irradiates the surface of the first component, the incident light may not be completely reflected by the first component to the first opening to exit. That is, the surface of one first component of the first electrode layer may be set to be non-planar, and the ambient light entering from the first opening may be reflected by the non-planar first component in different directions. Therefore, a part of the light may be reflected by the surface of the first component to the surface of the black matrix layer close to the first electrode layer, and then may be absorbed by the black matrix layer, reducing or even eliminating the light emitted from the first opening after being reflected by the first component of the first electrode layer. The influence of the reflected light on the display effect of the display panel may be avoided, to improve the display uniformity of the display panel and ensure the user experience.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:
1. A display panel, comprising:
a substrate;
a planarization layer on a side of the substrate;
a pixel definition layer on a side of the planarization layer away from the substrate;
a first electrode layer on a side of the pixel definition layer away from the planarization layer;
light-emitting elements; and
a black matrix layer on a side of the first electrode layer away from the pixel definition layer, wherein:
the black matrix layer is provided with;
the first electrode layer includes first components;
one first component overlaps a corresponding first opening; and
a surface of the first component is a non-planar surface, and
the first openings do not overlap the light-emitting elements, and wherein
the pixel definition layer is provided with second openings;
the second openings expose the planarization layer;
one first component covers a sidewall of one corresponding second opening and the planarization layer exposed by the corresponding second opening; and
a second recess is provided at a portion of the planarization layer exposed by one second opening, and one corresponding first component covers an inner sidewall of the second recess, or wherein:
the pixel definition layer is provided with second openings;
the second openings expose the planarization layer;
one first component covers a sidewall of one corresponding second opening and the planarization layer exposed by the corresponding second opening; and
along a first direction, a thickness of a portion of the planarization layer exposed by one second opening gradually decreases, the first direction being parallel to a direction of a plane where the substrate is located.

2. The display panel according to claim 1, wherein the non-planar surface includes a curved surface.

3. The display panel according to claim 2, wherein:
along the direction perpendicular to the plane where the substrate is located, a shape of the first component is a circle or an ellipse.

4. The display panel according to claim 3, wherein:
a diameter of the circle is larger than or equal to a size of one corresponding first opening or a long axis of the ellipse is larger than or equal to a size of one corresponding first opening; or an area of the circle is larger than or equal to an area of one corresponding first opening or an area of the ellipse is larger than or equal to an area of one corresponding first opening.

5. The display panel according to claim 2, wherein:
the curved surface includes a first point;
an angle between a tangent line of the curved surface at the first point and the plane where the substrate is located is $\alpha$, wherein $\alpha>0$;
horizontal distances between the first point and one corresponding first opening are V1 and V2 respectively, wherein V1>V2;
a vertical distance between the first point and the black matrix layer is H1; and
$\alpha \geq \arctan(V1/H1)*½$.

6. The display panel according to claim 1, wherein:
the non-planar surface includes concave surfaces, wherein the concave surfaces are recessed toward the substrate.

7. The display panel according to claim 1, wherein:
in the first direction, the first component includes a first side and a second side opposite to each other;
pointing from the first side to the second side, a vertical distance between the first component and the black matrix layer gradually increases;
the first electrode layer further includes second components and third components;
one second component is connected to one corresponding first component on the first side;
one third component is connected to one corresponding first component on the second side; and
a height of the second component is higher than the height of the third components.

8. The display panel according to claim 7, wherein:
a shape of one first opening is a strip;
a direction of a longest dimension of the strip is a second direction; and
the second direction intersects the first direction.

9. The display panel according to claim 1, wherein:
the non-planar surface is an inclined surface.

10. The display panel according to claim 1, wherein:
the first electrode layer includes second components;
the second components are parallel to the plane where the substrate is located;
one first component is connected to one corresponding second component.

11. The display panel according to claim 1, wherein:
a reflective transmission region is defined as an incident region corresponding to light along the direction perpendicular to the plane where the substrate is located that is able to be emitted through one first opening after it is incident on one corresponding first component through the first opening and is reflected by the corresponding first component; and
the reflective transmission region is smaller than a region where the first opening is located.

12. The display panel according to claim 1, wherein:
first recesses are provided on a side of the pixel definition layer facing the black matrix layer; and
one first component covers an inner sidewall of one corresponding first recess.

13. The display panel according to claim 1, wherein:
an opening of one second opening toward the planarization layer is larger than or equal to an opening of one corresponding second recess toward the pixel definition layer.

14. The display panel according to claim 1, further comprising an encapsulation layer in contact with the first components and located between the first electrode layer and the black matrix layer, wherein:
the first components are in contact with the pixel definition layer and an absolute value of a difference between the refractive index of the encapsulation layer and the refractive index of the pixel definition layer is less than or equal to 0.5; or
the first components are in contact with the pixel definition layer and the planarization layer, and an absolute value of a difference between the refractive index of the encapsulation layer and the refractive index of the pixel definition layer, and an absolute value of a difference between the refractive index of the encapsulation layer and the refractive index of the planarization layer are both less than or equal to 0.5.

15. The display panel according to claim 1, wherein:
the pixel definition layer is made of a material including a light-absorption material;
the pixel definition layer is provided with second openings; and
the second openings do not overlap the first openings in the direction perpendicular to the plane where the substrate is located.

16. The display panel according to claim 1, further comprising a color-blocking layer, wherein:
the color-blocking layer includes a plurality of color blockers filling the first openings.

17. The display panel according to claim 16, wherein:
the pixel definition layer is provided with fifth openings;
the light-emitting elements are located in the fifth openings;
the black matrix layer is provided with sixth openings;
the sixth openings overlap the light-emitting elements;
the plurality of color blockers also fill the sixth openings;
one of the plurality of color blockers filling one first opening and one of the plurality of color blockers filling one sixth opening adjacent to the first opening have different color.

18. A display device, comprising a display panel, wherein the display panel includes:
a substrate;
a planarization layer on a side of the substrate;
a pixel definition layer on a side of the planarization layer away from the substrate;
a first electrode layer on a side of the pixel definition layer away from the planarization layer;
light-emitting elements; and
a black matrix layer on a side of the first electrode layer away from the pixel definition layer, wherein:
the black matrix layer includes first openings;
the first electrode layer includes first components;
one first component overlaps a corresponding first opening; and
a surface of the first component is a non-planar surface, and
the first openings do not overlap the light-emitting elements, and wherein
the pixel definition layer is provided with second openings;
the second openings expose the planarization layer;
one first component covers a sidewall of one corresponding second opening and the planarization layer exposed by the corresponding second opening; and
a second recess is provided at a portion of the planarization layer exposed by one second opening, and one corresponding first component covers an inner sidewall of the second recess, or wherein:

the pixel definition layer is provided with second openings;

the second openings expose the planarization layer;

one first component covers a sidewall of one corresponding second opening and the planarization layer exposed by the corresponding second opening; and along a first direction, a thickness of a portion of the planarization layer exposed by one second opening gradually decreases, the first direction being parallel to a direction of a plane where the substrate is located.

* * * * *